US012713749B2

(12) United States Patent
Park et al.

(10) Patent No.: US 12,713,749 B2
(45) Date of Patent: Aug. 18, 2026

(54) DISPLAY DEVICE

(71) Applicant: Samsung Display Co., LTD., Yongin-si (KR)

(72) Inventors: Jang Soon Park, Yongin-si (KR); Hyun Wook Lee, Yongin-si (KR); Sung Geun Bae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 482 days.

(21) Appl. No.: 18/362,628

(22) Filed: Jul. 31, 2023

(65) Prior Publication Data

US 2024/0120453 A1 Apr. 11, 2024

(30) Foreign Application Priority Data

Oct. 11, 2022 (KR) ........................ 10-2022-0130024

(51) Int. Cl.
*H10H 20/857* (2025.01)
*H10H 20/01* (2025.01)
*H10H 20/819* (2025.01)
*H10W 90/00* (2026.01)

(52) U.S. Cl.
CPC ........ *H10H 20/857* (2025.01); *H10H 20/819* (2025.01); *H10H 20/0364* (2025.01); *H10W 90/00* (2026.01)

(58) Field of Classification Search
CPC ............... H10H 20/857; H10H 20/819; H10H 20/0364; H01L 25/167
See application file for complete search history.

(56) References Cited

U.S. PATENT DOCUMENTS

2020/0185573 A1* 6/2020 Shim ...................... H10K 59/38
2020/0403131 A1* 12/2020 Kim .................... H01L 25/0753
2022/0190071 A1* 6/2022 Bae ...................... H10K 59/122
2022/0199677 A1* 6/2022 Park ..................... H10H 20/831
2022/0254816 A1* 8/2022 Park ..................... H10D 89/931

FOREIGN PATENT DOCUMENTS

KR 10-2021-0140834 A 11/2021

OTHER PUBLICATIONS

Li et al., CN 114335052, Apr. 12, 2022 (Year: 2022).*

* cited by examiner

*Primary Examiner* — Mary Ellen Bowman
(74) *Attorney, Agent, or Firm* — Womble Bond Dickinson (US) LLP

(57) ABSTRACT

A display device includes a substrate, a via layer above the substrate, and including a protrusion, an insulating pattern above the protrusion, and having a width that is greater than a width of the protrusion, first and second electrodes above the via layer, and spaced apart from each other with the protrusion and the insulating pattern therebetween, a first insulating layer above the protrusion, the insulating pattern, the first electrode, and the second electrode, a light-emitting element above the first insulating layer, and between the first electrode and the second electrode, a first connection electrode connected to a first end of the light-emitting element, and a second connection electrode connected to a second end of the light-emitting element.

20 Claims, 21 Drawing Sheets

FIG. 4

PX
SPX1 SPX2 SPX3
CTD CTS
E1 E1'
BNL
ED
BP1
BP2
CNE1
CNE2
RME1
RME2
EMA
E2 E2'
ROP CT1 CT2 SA
DR1
DR2

RME: RME1, RME2
CNE: CNE1, CNE2

FIG. 6

CNE: CNE1, CNE2
RME: RME1, RME2

FIG. 8

PAS2
CNE1
CNE2
ED
PAS1
IPL
RME1
PRU
RME2
VIA
DR3

FIG. 11

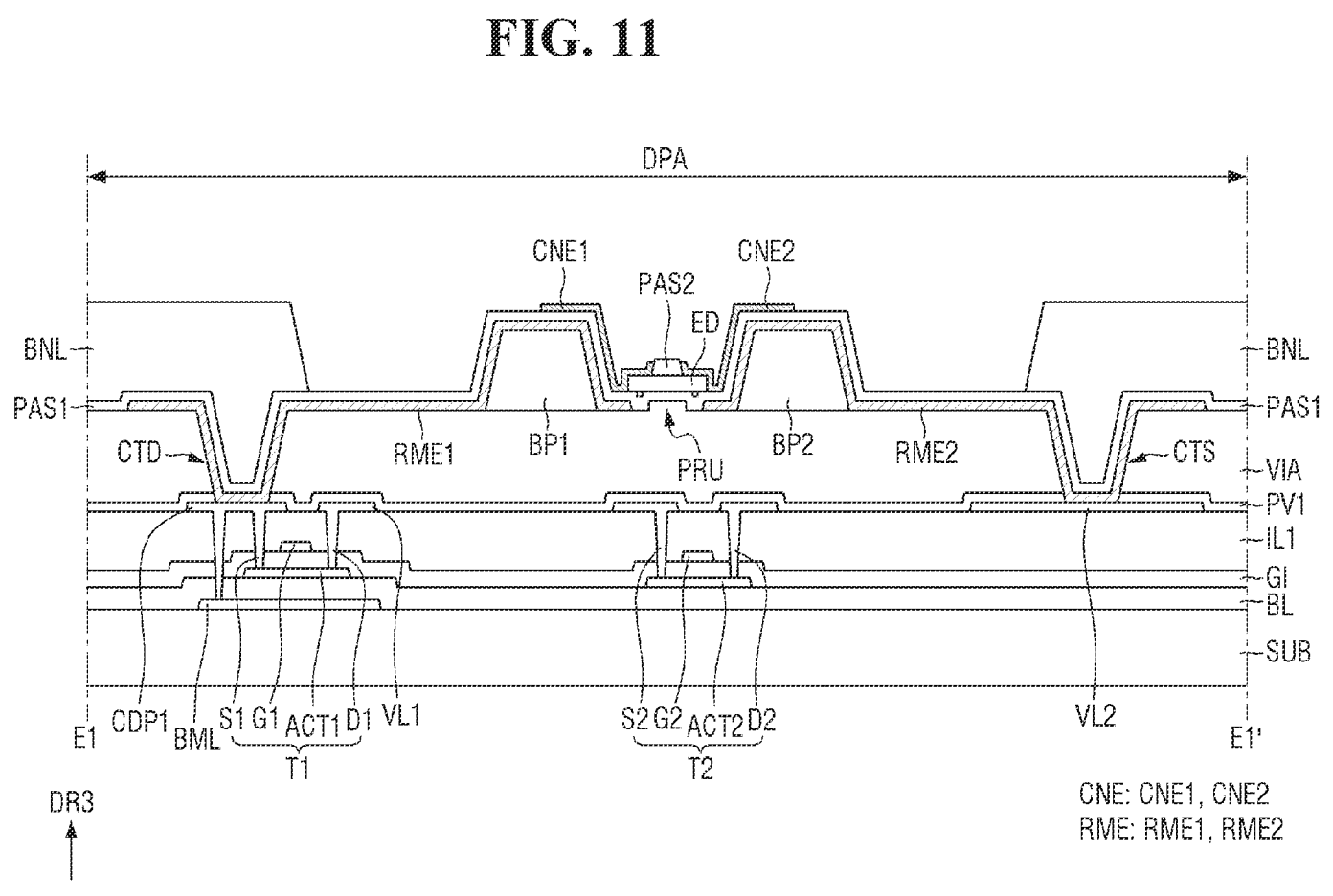

DPA
BNL
PAS1
VIA
PV1
IL1
GI
BL
SUB
E1
E1'
CTS
CTD
VL1
VL2
RME1
RME2
BP1
BP2
CNE1
CNE2
PAS2
ED
PRU
S1 G1 ACT1 D1
T1
S2 G2 ACT2 D2
T2
BML
CDP1
DR3
CNE: CNE1, CNE2
RME: RME1, RME2

FIG. 12

PAS2
CNE1
CNE2
ED
PAS1
PRU
RME1
T2
T1
RME2
VIA
W2
DR3
DD

FIG. 19

RME: RME1, RME2
CNE: CNE1, CNE2, CNE3
ED: ED1, ED2

FIG. 20

DISPLAY DEVICE

CROSS-REFERENCE TO RELATED APPLICATION

This application claims priority to, and the benefit of, Korean Patent Application No. 10-2022-0130024 filed on Oct. 11, 2022, in the Korean Intellectual Property Office, the disclosure of which is incorporated herein by reference in its entirety.

BACKGROUND

1. Field

The present disclosure relates to a display device.

2. Description of the Related Art

Display devices become more and more important as multimedia technology evolves. Accordingly, a variety of types of display devices, such as organic light-emitting display (OLED) devices and liquid-crystal display (LCD) devices, are currently used.

As a display device for displaying images, there is a self-luminous display device including light-emitting elements. Examples of such a self-luminous display device may include an organic light-emitting display device using an organic material as the light-emitting material for the light-emitting elements, or an inorganic light-emitting display device using an inorganic material as the light-emitting material for the light-emitting elements.

SUMMARY

Aspects of the present disclosure provide a display device capable of reducing or preventing the likelihood of a short-circuit failure of electrodes. It should be noted that aspects of the present disclosure are not limited to the above-mentioned object; and other aspects of the present disclosure will be apparent to those skilled in the art from the following descriptions.

According to an aspect of the present disclosure, a display device comprises a substrate, a via layer above the substrate, and including a protrusion, an insulating pattern above the protrusion, and having a width that is greater than a width of the protrusion, first and second electrodes above the via layer, and spaced apart from each other with the protrusion and the insulating pattern therebetween, a first insulating layer above the protrusion, the insulating pattern, the first electrode, and the second electrode, a light-emitting element above the first insulating layer, and between the first electrode and the second electrode, a first connection electrode connected to a first end of the light-emitting element, and a second connection electrode connected to a second end of the light-emitting element.

The protrusion and the via layer may be integral, wherein the protrusion protrudes toward the light-emitting element.

The protrusion and the insulating pattern may overlap the light-emitting element.

A side surface of the insulating pattern may protrude outwardly more than a side surface of the protrusion.

A width of the protrusion and a width of the insulating pattern may be less than a distance between the first electrode and the second electrode.

A thickness of the protrusion and a thickness of the insulating pattern may be less than a thickness of the first electrode or the second electrode.

A sum of a thickness of the protrusion and a thickness of the insulating pattern may be equal to a thickness of the first electrode or the second electrode.

A side surface of the protrusion may be perpendicular to a surface of the via layer.

A side surface of the protrusion may be inclined, wherein a width of an upper surface of the protrusion is less than a width of a lower surface of the protrusion.

The first insulating layer may be in contact with a lower surface of the light-emitting element where the insulating pattern and the light-emitting element overlap each other.

According to an aspect of the present disclosure, a display device includes a substrate, a via layer above the substrate, and including a protrusion, first and second electrodes above the via layer, and spaced apart from each other with the protrusion therebetween, a first insulating layer above the protrusion, the first electrode, and the second electrode, a light-emitting element above the first insulating layer, and between the first electrode and the second electrode, a first connection electrode connected to a first end of the light-emitting element, and a second connection electrode connected to a second end of the light-emitting element, wherein a thickness of the protrusion is equal to a thickness of the first electrode or the second electrode.

The protrusion and the via layer may be integral, wherein the protrusion protrudes toward the light-emitting element.

An upper surface of the protrusion may be in contact with the first insulating layer, wherein the first insulating layer is in contact with a lower surface of the light-emitting element.

A width of the protrusion may be less than a distance between the first electrode and the second electrode.

The display device may further include a second insulating layer above the light-emitting element, wherein the first connection electrode and the second connection electrode are spaced apart from each other with the second insulating layer therebetween.

According to an aspect of the present disclosure, a method of fabricating a display device includes forming a via layer above a substrate, forming an insulating pattern above the via layer, forming a protrusion under the insulating pattern by etching the via layer, forming first and second electrodes spaced apart from each other above the via layer, forming a first insulating layer above the insulating pattern, the first electrode, and the second electrode, aligning a light-emitting element above the first insulating layer between the first electrode and the second electrode, forming a first connection electrode connected to a first end of the light-emitting element, and forming a second connection electrode connected to a second end of the light-emitting element.

The forming the protrusion may include reducing a thickness of the via layer by using the insulating pattern as a hard mask.

The protrusion may be over-etched underneath the insulating pattern to be formed in an under-cut shape.

A sum of a thickness of the protrusion and a thickness of the insulating pattern may be equal to a thickness of the first electrode or the second electrode.

The first insulating layer may be in contact with a lower surface of the light-emitting element.

According to one or more embodiments of the present disclosure, a protrusion and an insulating pattern are formed under light-emitting elements to reduce or eliminate a space between light-emitting elements and a first passivation layer, where otherwise a first connection electrode and a second connection electrode can form a short circuit, thereby reducing or preventing the likelihood of a short-circuit failure.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which:

FIG. 4 is a plan view showing a pixel of a display device according to one or more embodiments of the present disclosure.

FIG. 6 is a cross-sectional view taken along the line E2-E2' of FIG. 4.

FIGS. 7 and 8 are views illustrating a variety of structures of a portion of a display device according to one or more embodiments.

FIG. 11 is a cross-sectional view showing a display device according to one or more other embodiments of the present disclosure.

FIG. 12 is an enlarged view of a portion of FIG. 11.

FIG. 19 is a cross-sectional view taken along the line E5-E5' of FIG. 18.

FIG. 20 is a cross-sectional view taken along the line E6-E6' of FIG. 18.

DETAILED DESCRIPTION

Figure 1:
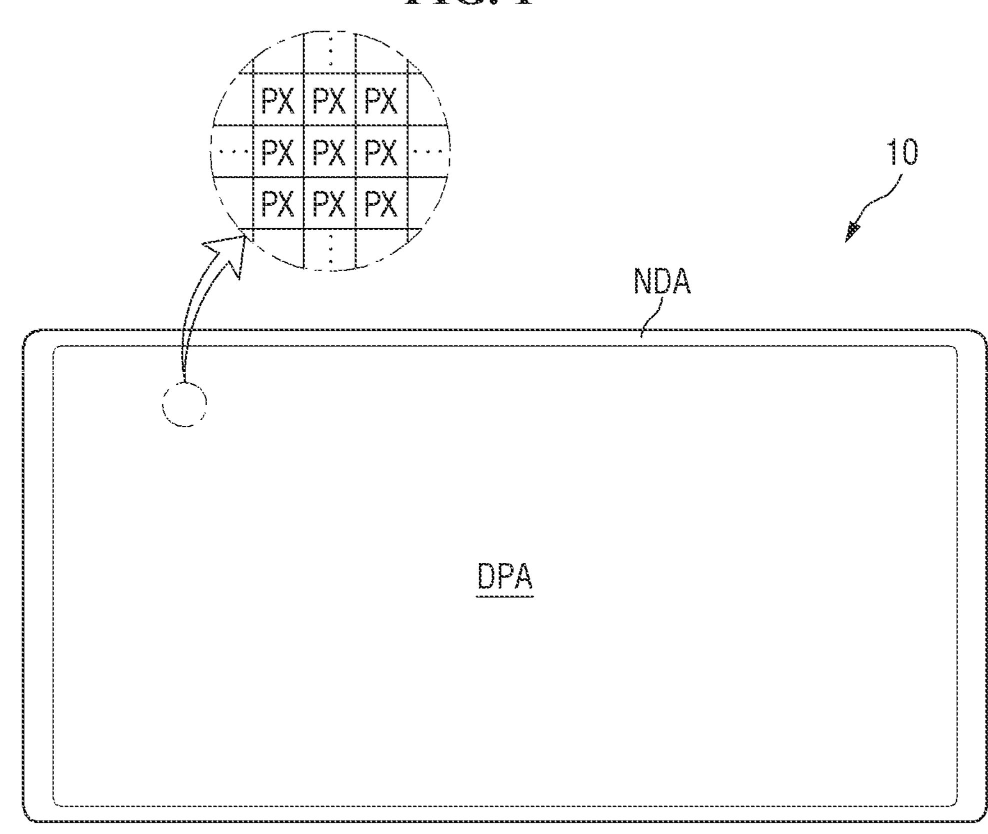
FIG. 1 is a plan view of a display device according to one or more embodiments of the present disclosure.
Figure 1:
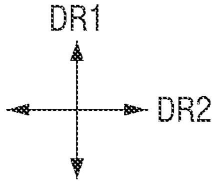

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B"

and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view of a display device according to one or more embodiments of the present disclosure.

Referring to FIG. 1, the display device 10 displays a moving image or a still image. A display device 10 may refer to any electronic device that provides a display screen. For example, the display device 10 may include a television set, a laptop computer, a monitor, an electronic billboard, the Internet-of-Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display device 10, but the present disclosure is not limited thereto. Any other display panel may be employed as long as the technical idea of the present disclosure can be equally applied.

The shape of the display device 10 may be modified in a variety of ways. For example, the display device 10 may have shapes, such as a rectangle with longer lateral sides, a rectangle with longer vertical sides, a square, a quadrangle with rounded corners (vertices), other polygons, a circle, etc. The shape of a display area DPA of the display device 10 may also be similar to the overall shape of the display device 10. In the example shown in FIG. 1, the display device 10 has a rectangular shape with the longer sides in a second direction DR2.

The display device 10 may include a display area DPA and a non-display area NDA. In the display area DPA, images can be displayed. In the non-display area NDA, images are not displayed. The display area DPA may be referred to as an active area, while the non-display area NDA may also be referred to as an inactive area. The display area DPA may generally occupy the majority of the center of the display device 10.

The display area DPA may include a plurality of pixels PX. The plurality of pixels PX may be arranged in a matrix. The shape of each pixel PX may be, but is not limited to, a rectangle or a square in plan view. Each pixel may have a diamond shape having sides inclined with respect to a direction. The pixels PX may be arranged in stripes or in a pattern of islands. Each of the pixels PX may include one or more light-emitting elements each emitting light of a corresponding wavelength band to represent a color.

The non-display area NDA may be located around the display area DPA. The non-display area NDA may surround the display area DPA entirely or partially. The display area DPA may have a rectangular shape, and the non-display area NDA may be adjacent to the four sides of the display area DPA. The non-display area NDA may form the bezel of the display device 10. Lines or circuit drivers included in the display device 10 may be located in each of the non-display area NDA, or external devices may be mounted.

Figure 2:
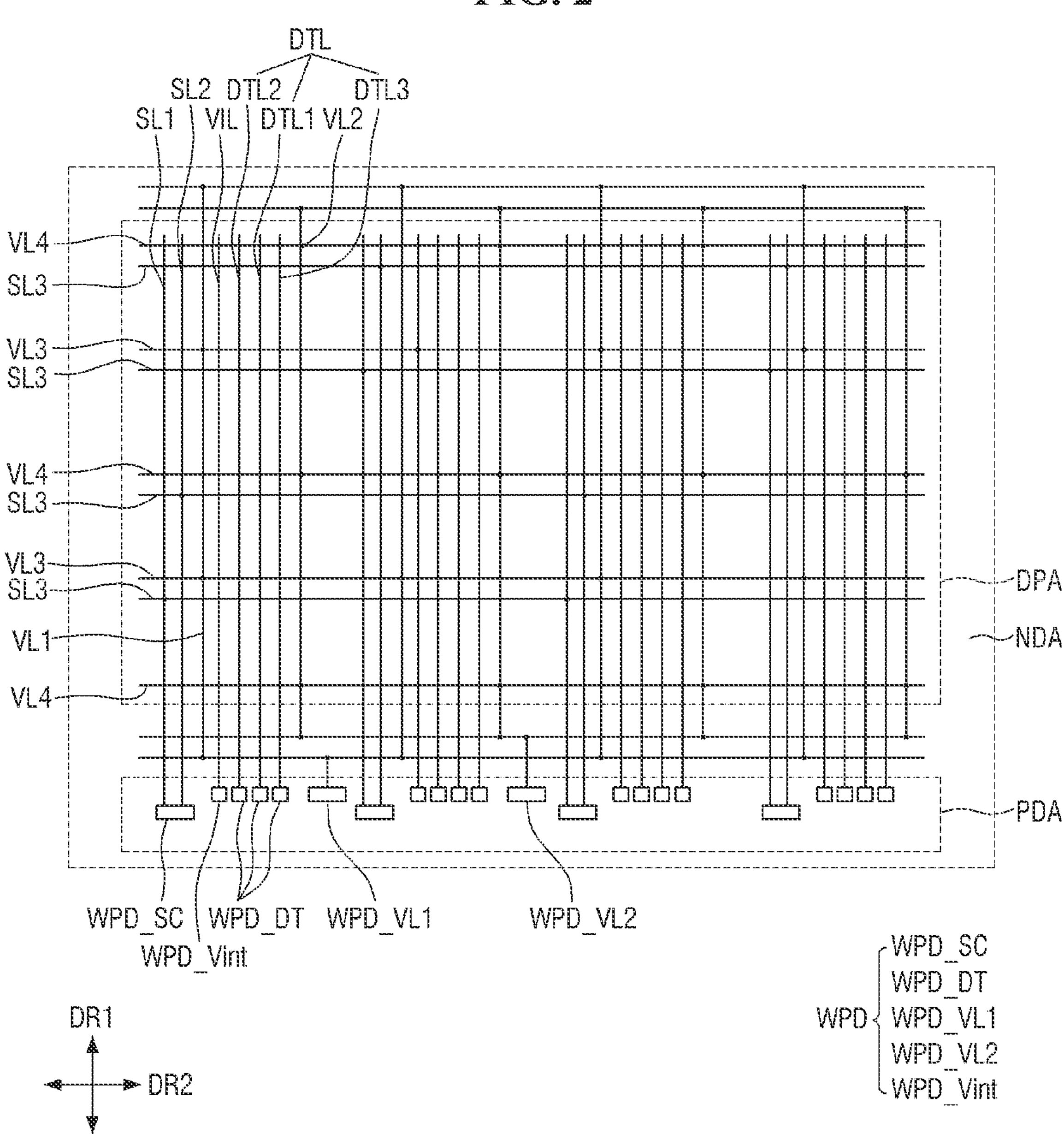
FIG. 2 is a plan view showing arrangement of a plurality of lines included in a display device according to one or more embodiments of the present disclosure.

FIG. 2 is a plan view showing arrangement of a plurality of lines included in a display device according to one or more embodiments of the present disclosure.

Referring to FIG. 2, the display device 10 may include a plurality of lines. The display device 10 may include a plurality of scan lines SL (SL1, SL2, and SL3), a plurality of data lines DTL (DTL1, DTL2, and DTL3), an initialization voltage line VIL, and a plurality of voltage lines VL (VL1, VL2, VL3, and VL4). Other lines may be further located in the display device 10.

The first scan line SL1 and the second scan line SL2 may extend in the first direction DR1. The first scan line SL1 and the second scan line SL2 may be adjacent to each other, and may be spaced apart from other first and second scan lines SL1 and SL2 in the second direction DR2. The first scan line SL1 and the second scan line SL2 may be connected to a scan wire pad WPD_SC connected to a scan driver. The first scan line SL1 and the second scan line SL2 may extend from a pad area PDA, which may be located in the non-display area NDA, to the display area DPA.

The third scan line SL3 may extend in the second direction DR2, and may be spaced apart from another third scan line SL3 in the first direction DR1. One third scan line SL3 may be connected to one or more first scan lines SL1 or to one or more second scan lines SL2. According to one or more embodiments of the present disclosure, the first scan line SL1 and the second scan line SL2 may be formed as a conductive layer that is located on a different layer from the third scan line SL3. The plurality of scan lines SL may have, but is not limited to, a mesh structure on the entire surface of the display area DPA.

As used herein, when an element is referred to as being "connected" or "coupled" to another element, it can be directly connected or coupled to the element or intervening elements may be present. In addition, such elements may be understood as a single integrated element with one portion thereof connected to another portion. Moreover, when an element is referred to as being "connected" to another element, it may be in direct contact with the element and also electrically connected to the element.

The data lines DTL may extend in the first direction DR1. The data lines DTL may include a first data line DTL1, a second data line DTL2, and a third data line DTL3. The first to third data lines DTL1, DTL2, and DTL3 are located adjacent to one another as a group. The data lines DTL1, DTL2, and DTL3 may extend from the pad area PDA, which may be located in the non-display area NDA, to the display area DPA. It should be understood, however, that the present disclosure is not limited thereto. The data lines DTL may be spaced apart from a first voltage line VL1 and a second voltage line VL2 to be described later.

The initialization voltage line VIL may extend in the first direction DR1. The initialization voltage line VIL may be located between a corresponding group of the data lines DTL and the first and second scan lines SL1 and SL2. The initialization voltage line VIL may extend from the pad area PDA, which may be located in the non-display area NDA, to the display area DPA.

The first voltage line VL1 and the second voltage line VL2 may extend in the first direction DR1, and the third voltage line VL3 and the fourth voltage line VL4 may extend in the second direction DR2. The first voltage line VL1 and the second voltage line VL2 may be arranged alternately in the second direction DR2, and the third voltage line VL3 and the fourth voltage line VL4 may be arranged alternately in the first direction DR1. The first voltage lines VL1 and the second voltage lines VL2 may extend in the first direction DR1, and may traverse the display area DPA. Some of the third voltage line VL3 and the fourth voltage lines VL4 may be located in the display area DPA, while the others may be located in the non-display area NDA located on respective sides of the display area DPA in the first direction DR1. The first voltage lines VL1 and the second voltage lines VL2 may be formed as a conductive layer that is located on a different layer from the third voltage lines VL3 and the fourth voltage lines VL4. The first voltage line VL1 may be connected to at least one third voltage line VL3, and the second voltage line VL2 may be connected to at least one fourth voltage line VL4, such that the plurality of voltage lines VL may have a mesh structure in the entirely display are DPA. It is, however, to be understood that the present disclosure is not limited thereto.

The first scan lines SL1, the second scan lines SL2, the data lines DTL, the initialization voltage line VIL, the first voltage lines VL1, and the second voltage lines VL2 may be electrically connected to one or more wire pads WPD. The wire pads WPD may be located in the non-display areas NDA. The wire pads WPD may be located in the pad area PDA located on the lower side of the display area DPA. The first and second scan lines SL1 and SL2 may be connected to the scan wire pad WPD_SC located in the pad area PDA, and the data lines DTL may be connected to respective data wire pads WPD_DT. The initialization voltage line VIL may be connected to the initialization wiring pad WPD_Vint, the first voltage line VL1 may be connected to a first voltage wire pad WPD_VL1, and the second voltage line VL2 may be connected to the second voltage wire pad WPD_VL2. External devices may be mounted on the wire pads WPD. External devices may be mounted on the wire pads WPD by an anisotropic conductive film, ultrasonic bonding, etc. Although the wire pads WPD are located in the pad area PDA located on the lower side of the display area DPA in the drawings, the present disclosure is not limited thereto. Some of the plurality of wire pads WPD may be located on the upper side or on one of the left and right sides of the display area DPA.

Each of the pixels PX or sub-pixels SPXn of the display device 10 includes a pixel driving circuit, where n is an integer of 1 to 3. The above-described lines may pass through each of the pixels PX, or the periphery thereof, to apply a driving signal to the pixel driving circuit. The pixel driving circuit may include a transistor and a capacitor. The numbers of transistors and capacitors of each pixel driving circuit may be changed in a variety of ways. According to one or more embodiments of the present disclosure, each of the sub-pixels SPXn of the display device 10 may have a 3T1C structure (e.g., a pixel driving circuit includes three transistors and one capacitor). In the following description, the pixel driving circuit having the 3T1C structure will be described as an example. It is, however, to be understood that the present disclosure is not limited thereto. A variety of modified structure may be employed, such as a 2T1C structure, a 7T1C structure, and a 6T1C structure.

Figure 3:
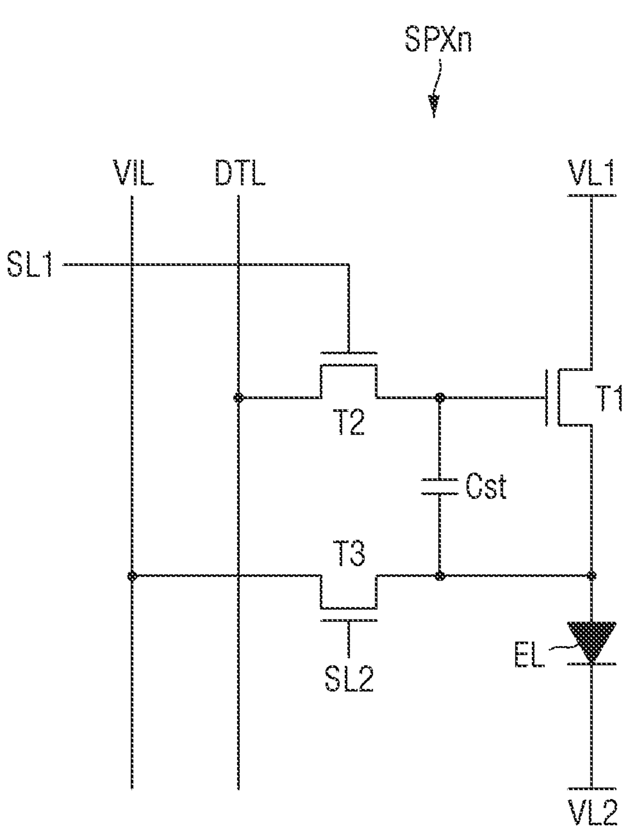
FIG. 3 is an equivalent circuit diagram of a sub-pixel according to one or more embodiments of the present disclosure.

FIG. 3 is an equivalent circuit diagram of a sub-pixel according to one or more embodiments of the present disclosure.

Referring to FIG. 3, each of the sub-pixels SPXn of the display device 10 according to one or more embodiments includes three transistors T1, T2, and T3 and one storage capacitor Cst in addition to a light-emitting diode EL.

The light-emitting diode EL emits light in proportion to the current supplied through the first transistor T1. The light-emitting diode EL includes a first electrode, a second electrode, and at least one light-emitting element located therebetween. The light-emitting element may emit light in a corresponding wavelength range by an electric signal transmitted from the first electrode and the second electrode.

A first end of the light-emitting diode EL may be connected to a source electrode of the first transistor T1, and a second end thereof may be connected to a second voltage line VL2 from which a low-level voltage (hereinafter referred to as a second supply voltage), which is lower than a high-level voltage (hereinafter referred to as a first supply voltage) of a first voltage line VL1, is applied.

The first transistor T1 adjusts a current flowing from the first voltage line VL1 from which the first supply voltage is supplied to the light-emitting diode EL according to the voltage difference between a gate electrode and the source electrode. For example, the first transistor T1 may be a driving transistor for driving the light-emitting diode EL. The gate electrode of the first transistor T1 may be connected to a source electrode of the second transistor T2, the source electrode thereof may be connected to the first electrode of the light-emitting diode EL, and the drain electrode thereof may be connected to the first voltage line VL1 from which the first supply voltage is applied.

The second transistor T2 is turned on by a scan signal of the first scan line SL1 to connect the data line DTL with the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

A third transistor T3 may be turned on by a scan signal of a second scan line SL2 to connect the initialization voltage line VIL with the first end of the light-emitting diode EL. The gate electrode of the third transistor T3 may be connected to the second scan line SL2, the drain electrode thereof may be connected to the initialization voltage line VIL, and the source electrode thereof may be connected to one end of the light-emitting diode EL or to the source electrode of the first transistor T1.

The source electrode and the drain electrode of each of the transistors T1, T2, and T3 are not limited to those described above. They may be connected in the opposite way. In addition, each of the transistors T1, T2, and T3 may be formed as a thin-film transistor. In addition, although each of the transistors T1, T2, and T3 implemented as an n-type MOSFET (metal oxide semiconductor field effect transistor) in the example shown in FIG. 3, the present disclosure is not limited thereto. That is to say, each of the transistors T1, T2, and T3 may be implemented as a p-type MOSFET, or some of the transistors T1, T2, and T3 may be implemented as n-type MOSFETs while the others may be implemented as p-type MOSFETs.

The storage capacitor Cst is formed between the gate electrode and the source electrode of the first transistor T1. The storage capacitor Cst stores a voltage difference between the gate voltage and the source voltage of the first transistor T1.

Hereinafter, the structure of one pixel PX of the display device 10 according to one or more embodiments will be described in detail with reference to other drawings.

Figure 4:
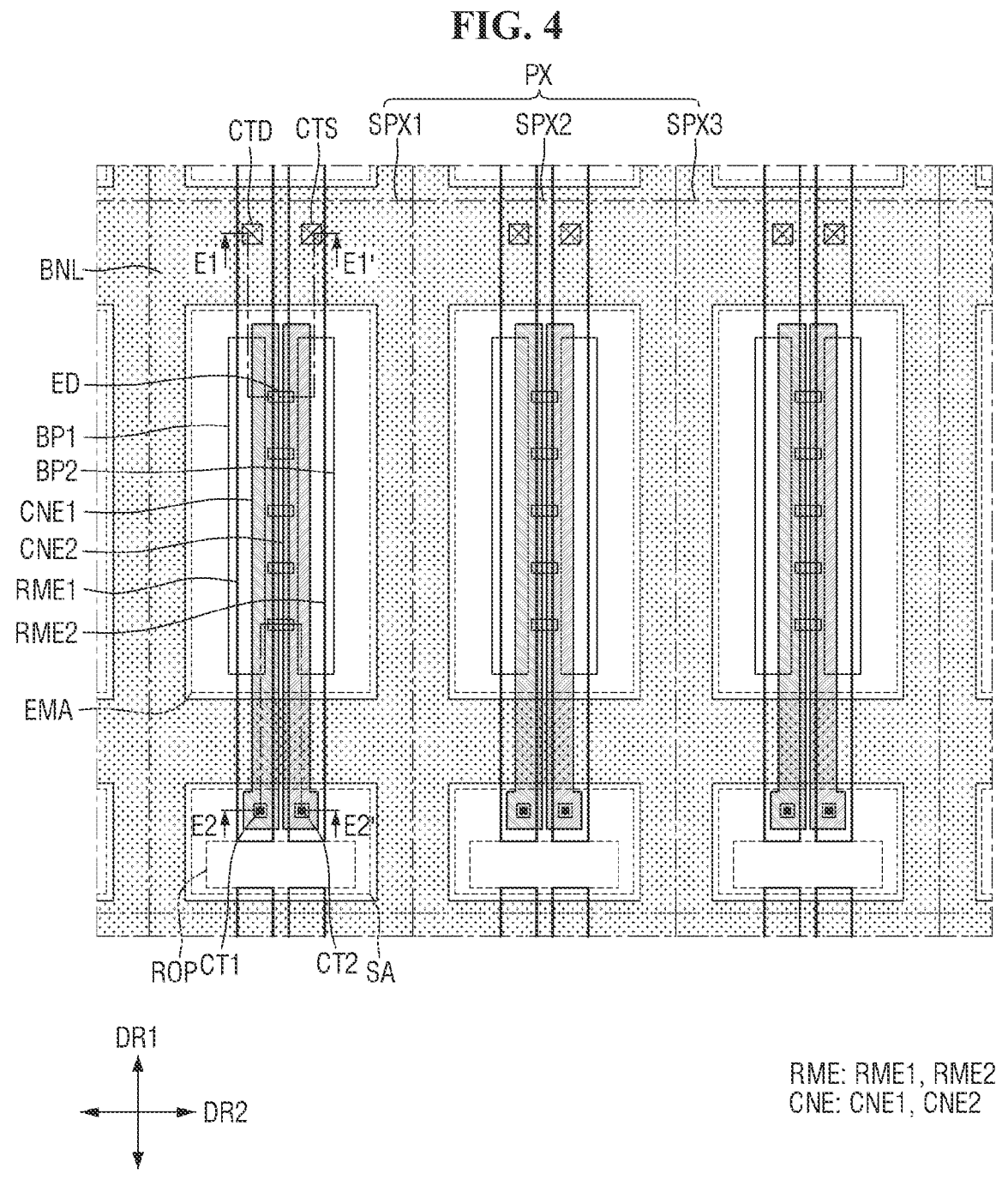

FIG. 4 is a plan view showing a pixel of a display device according to one or more embodiments of the present disclosure. FIG. 4 shows a layout of electrodes RME (RME1 and RME2), bank patterns BP1 and BP2, a bank layer BNL, light-emitting elements ED, and connection electrodes CNE (CNE1 and CNE2) located in a pixel PX of a display device 10 in plan view.

Referring to FIG. 4, each of the pixels PX of the display device 10 may include a plurality of sub-pixels SPXn. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. It is, however, to be understood that the present disclosure is not limited thereto. All the sub-pixels SPXn may emit light of the same color. According to one or more embodiments of the present disclosure, the sub-pixels SPXn may emit blue light. Although the single pixel PX includes three sub-pixels SPXn in the example shown in the drawings, the present disclosure is not limited thereto. The pixel PX may include more than three sub-pixels SPXn.

Each of the sub-pixels SPXn of the display device 10 may include an emission area EMA and a non-emission area. In the emission area EMA, light-emitting elements ED are located to emit light of a corresponding wavelength band. In the non-emission area, the light-emitting elements ED are omitted, and the lights emitted from the light-emitting elements ED do not reach, and thus, no light exits therefrom.

The emission area EMA may include an area in which the light-emitting elements ED are located, and may include an area adjacent to the light-emitting elements ED where lights, which are emitted from the light-emitting elements ED, exit. For example, the emission area EMA may also include an area in which lights emitted from the light-emitting elements ED are reflected or refracted by other elements to exit. The plurality of light-emitting elements ED may be located in each of the sub-pixels SPXn, and the emission area may include the area where the light-emitting elements are located and the adjacent area.

Although the emission areas EMA of the sub-pixels SPXn have the uniform area in the example shown in the drawings, the present disclosure is not limited thereto. In some embodiments, the emission areas EMA of the sub-pixels SPXn may have different areas depending on a color or wavelength band of light emitted from the light-emitting elements ED located in the respective sub-pixels.

Each of the sub-pixels SPXn may further include a subsidiary area SA located in the non-emission area. The subsidiary area SA of each sub-pixel SPXn may be located on the lower side of the emission area EMA that is the opposite side in the first direction DR1. The emission areas EMA and the subsidiary areas SA may be arranged alternately in the first direction DR1, and each subsidiary area SA may be located between the emission areas EMA of different sub-pixels SPXn spaced apart from each other in the first direction DR1. For example, the emission areas EMA and the subsidiary areas SA may be alternately arranged in the first direction DR1, and the emission areas EMA and the subsidiary areas SA may each be repeatedly arranged in the second direction DR2. It is, however, to be understood that the present disclosure is not limited thereto. The emission areas EMA and the subsidiary areas SA of the plurality of pixels PX may have an arrangement different from that of FIG. 4.

No light-emitting diode ED is located in the subsidiary areas SA, and thus no light exits therefrom. The electrodes RME located in the sub-pixels SPXn may be partially located in the subsidiary areas SA. The electrodes RME located in different sub-pixels SPXn may be spaced apart, or separated, from one another at separation regions ROP of the subsidiary areas SA.

The lines and circuit elements of the circuit layer located in each pixel PX and connected to the light-emitting elements ED may be connected to the first to third sub-pixels SPX1, SPX2, and SPX3. It should be noted that the lines and circuit elements may be omitted from the area occupied by each sub-pixel SPXn or the emission area EMA, but may be located regardless of the location of the emission area EMA in one pixel PX.

The bank layer BNL may surround the plurality of sub-pixels SPXn, the emission area EMA and the subsidiary area SA. The bank layer BNL may be located at the boundary between the sub-pixels SPXn adjacent to each other in the first direction DR1 and the second direction DR2, and may also be located at the boundary between the emission area EMA and the subsidiary area SA. The sub-pixels SPXn, the emission areas EMA, and the subsidiary areas SA of the display device 10 may be distinguished from one another by the bank layer BNL. The distance between the plurality of sub-pixels SPXn, the emission areas EMA, and the subsidiary areas SA may vary depending on the width of the bank layer BNL.

The bank layer BNL may be located in a lattice pattern on the front surface of the display area DPA including portions extended in the first direction DR1 and the second direction DR2 in plan view. The bank layer BNL may be located along the border of each of the sub-pixels PXn to distinguish between adjacent sub-pixels PXn. In addition, the bank layer BNL may surround the emission area EMA and the subsidiary area SA located in each of the sub-pixels SPXn to distinguish between them.

Figure 5:
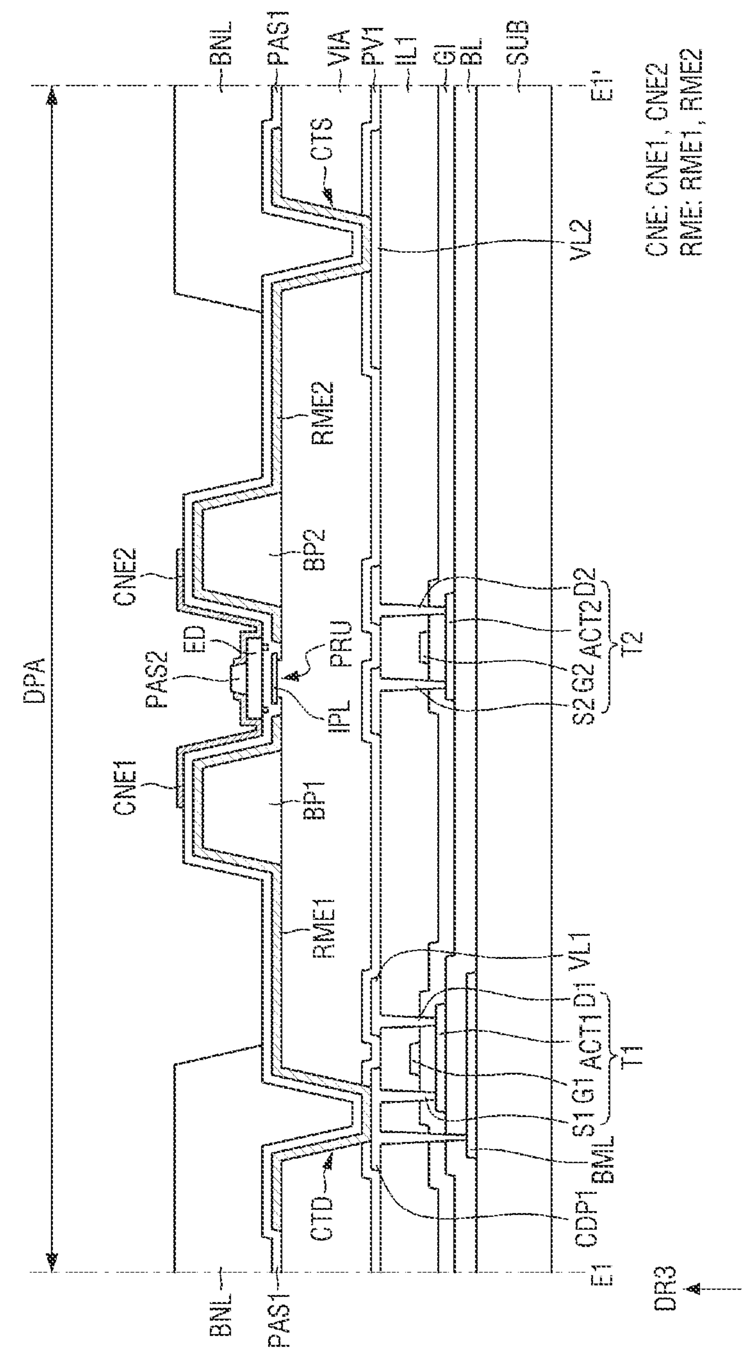
FIG. 5 is a cross-sectional view taken along the line E1-E1' of FIG. 4.
Figure 6:
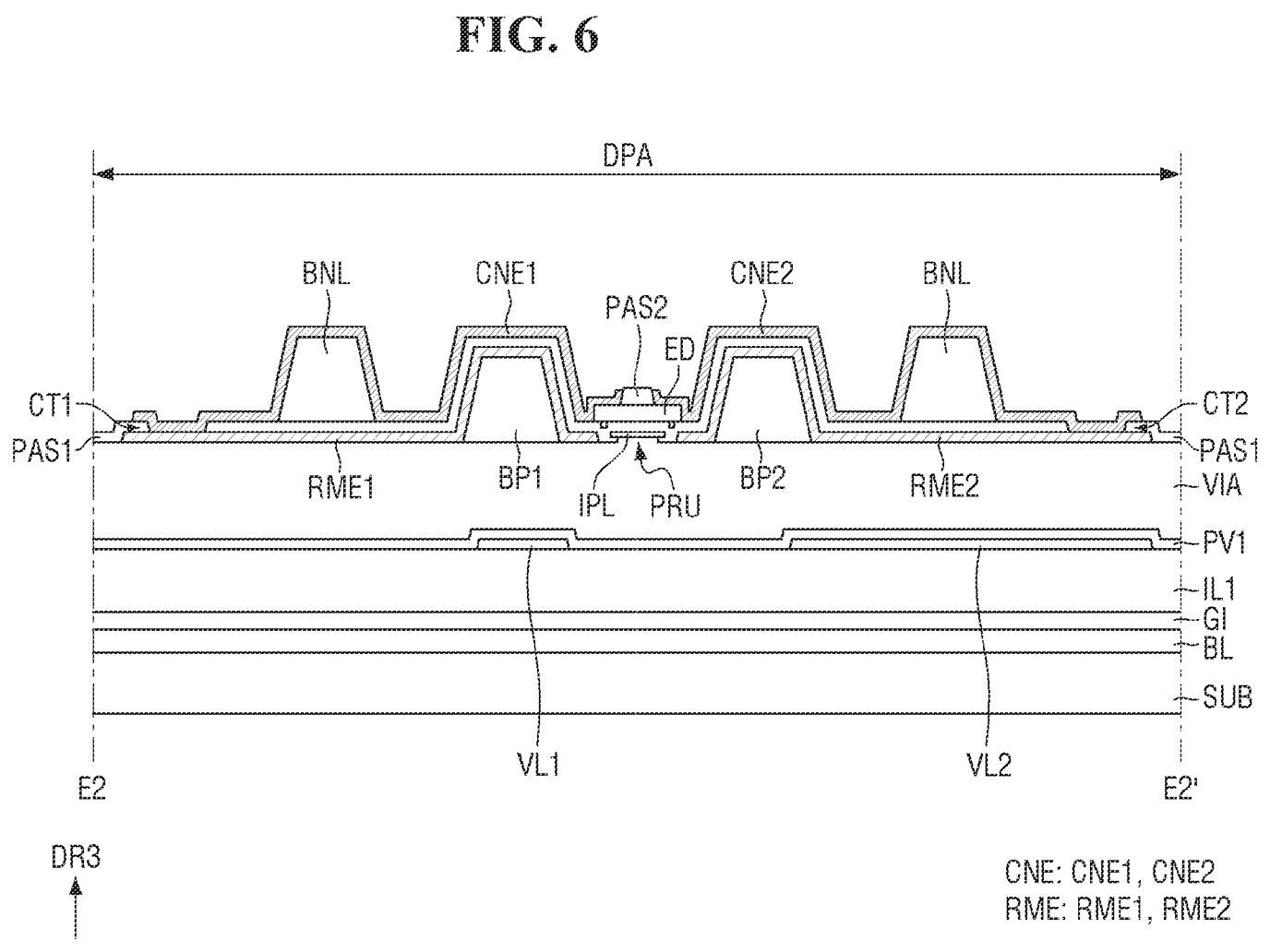
Figure 7:
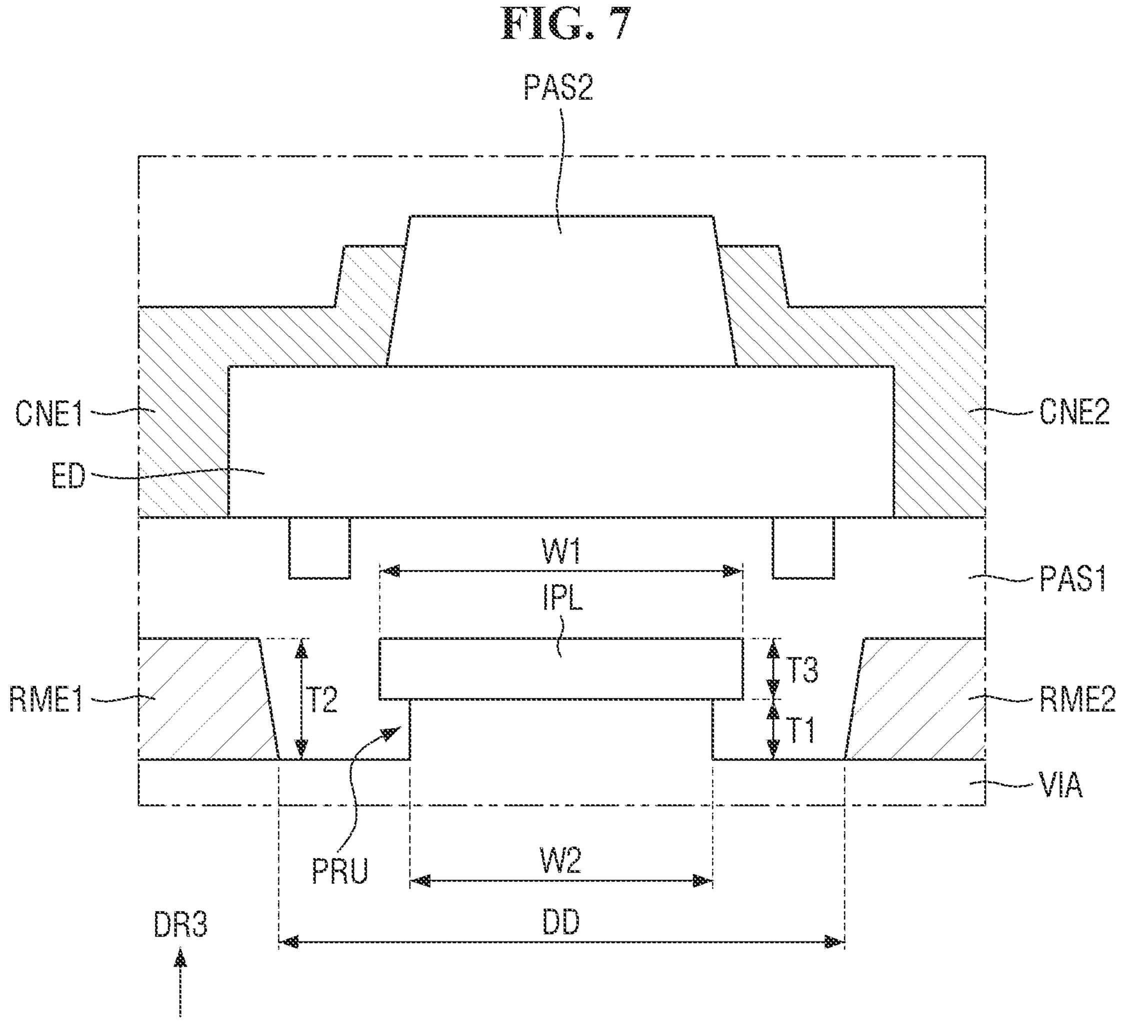
Figure 8:
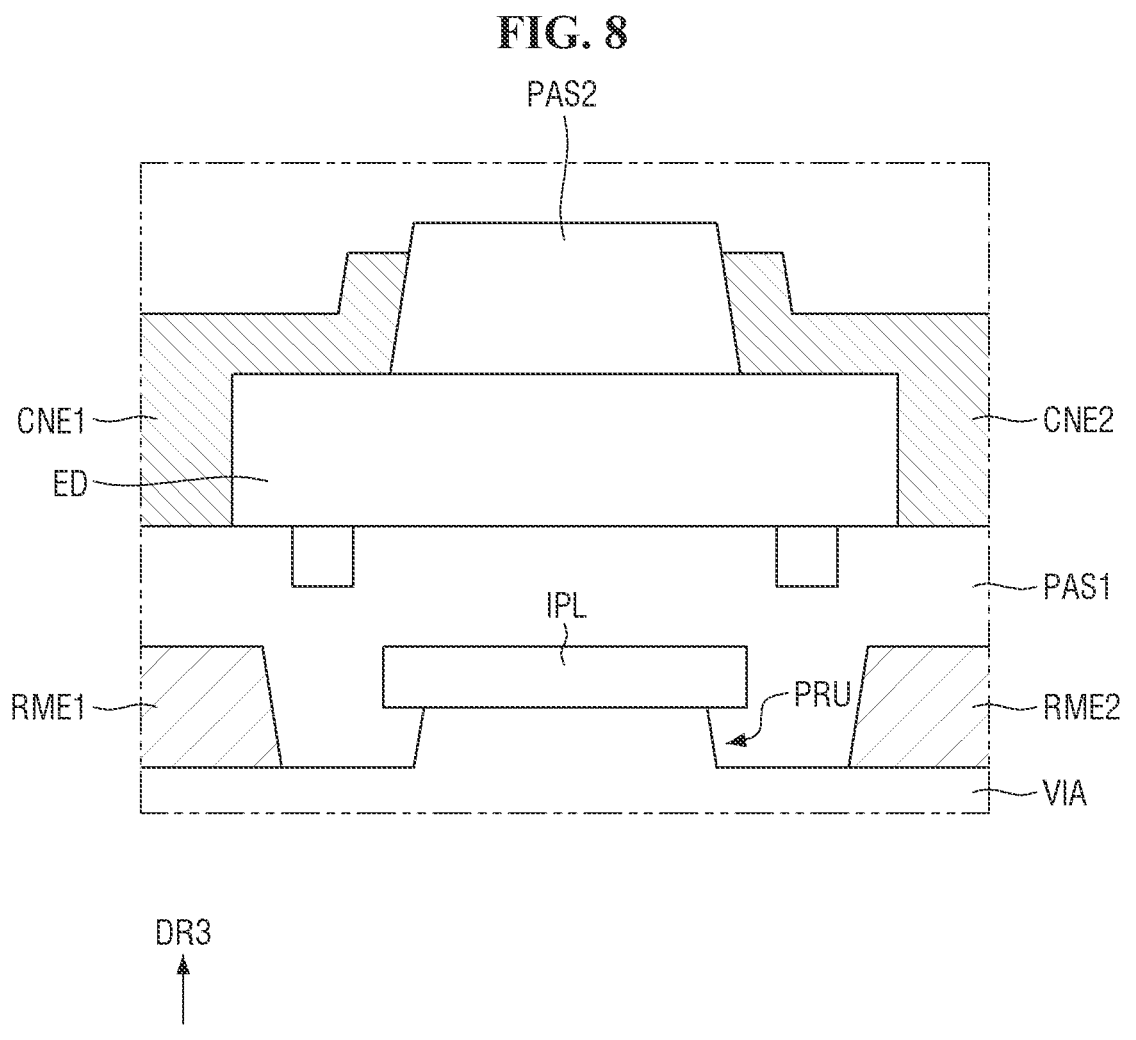
Figure 9:
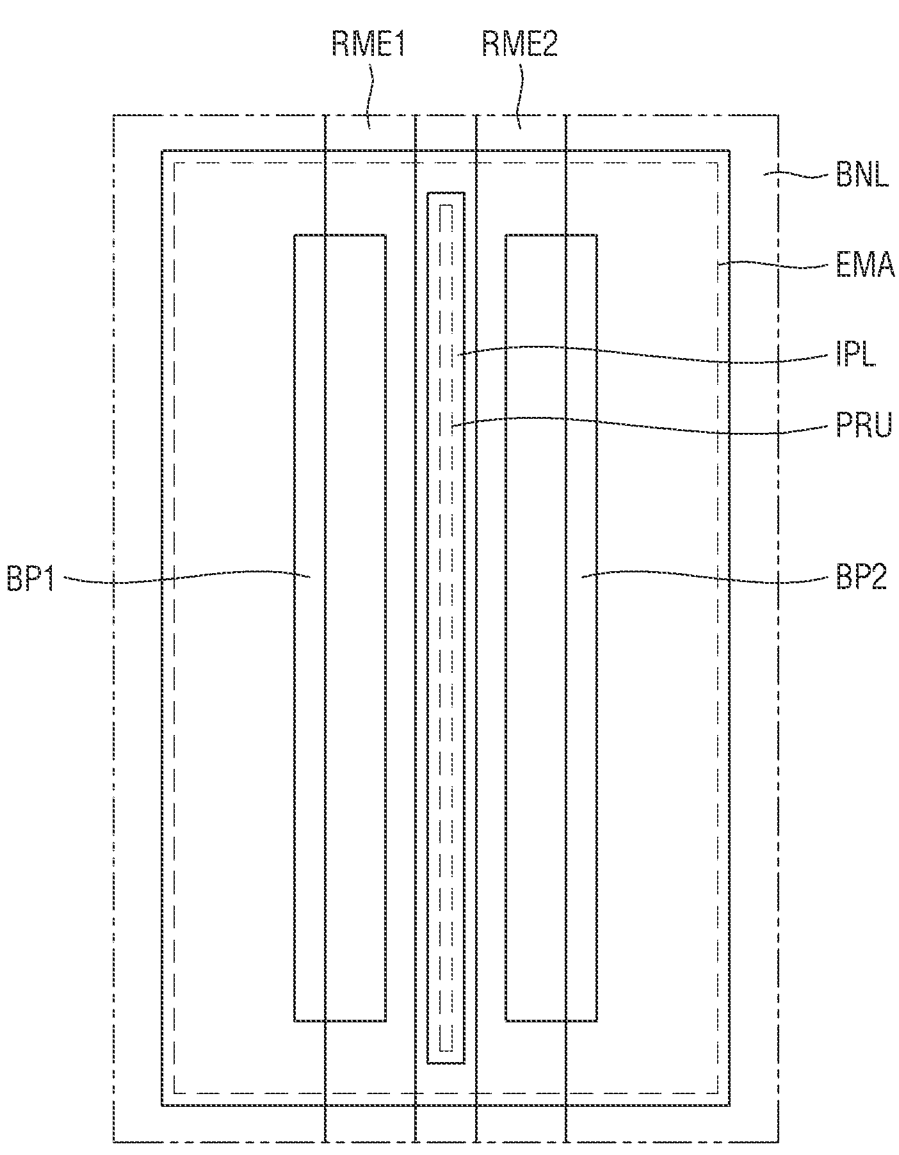
FIG. 9 is a plan view schematically showing an emission area of a display device according to one or more embodiments.

FIG. 5 is a cross-sectional view taken along the line E1-E1' of FIG. 4. FIG. 6 is a cross-sectional view taken along the line E2-E2' of FIG. 4. FIGS. 7 and 8 are views illustrating a variety of structures of a portion of a display device according to one or more embodiments. FIG. 9 is a plan view schematically showing an emission area of a display device according to one or more embodiments.

FIG. 5 shows a cross section passing through the both ends of the light-emitting elements ED located in the first sub-pixel SPX1 and electrode contact holes CTD and CTS. FIG. 6 shows a cross section passing through the both ends of the light-emitting elements ED located in the first sub-pixel SPXn and contacts CT1 and CT2. FIGS. 7 and 8 show a protrusion PRU of a via layer VIA and an insulating pattern IPL. FIG. 9 shows a layout of the protrusion PRU in plan view.

Referring to FIGS. 5 to 9 in conjunction with FIG. 4, the display device 10 may include a first substrate SUB, and a semiconductor layer, a plurality of conductive layers, and a plurality of insulating layers located on the first substrate SUB. In addition, the display device 10 may include a plurality of electrodes RME (RME1 and RME2), light-emitting elements ED, and connection electrodes CNE (CNE1 and CNE2) located on the first substrate SUB. The semiconductor layer, the conductive layers, and the insulating layers may form a circuit layer of the display device 10.

The first substrate SUB may be an insulating substrate. The first substrate SUB may be made of an insulating material, such as glass, quartz, and/or a polymer resin. The first substrate SUB may be either a rigid substrate, or a flexible substrate that can be bent, folded, or rolled. The first substrate SUB may include the display area DPA, and the non-display area NDA surrounding the display area DPA. The display area DPA may include the emission area EMA and the subsidiary area SA which is a portion of the non-emission area.

A first conductive layer may be located on the first substrate SUB. The first conductive layer includes a bottom metal layer BML. The bottom metal layer BML is located to overlap an active layer ACT1 of a first transistor T1. The bottom metal layer BML may reduce or prevent light incident on the first active layer ACT1 of the first transistor, or may be electrically connected to the first active layer ACT1 to stabilize the electrical characteristics of the first transistor T1. It is to be noted that the bottom metal layer BML may be eliminated.

A buffer layer BL may be located on the bottom metal layer BML and the first substrate SUB. The buffer layer BL may be formed on the first substrate SUB to protect the transistors of the pixel PX from moisture permeating through the first substrate SUB, which may be susceptible to moisture permeation, and may also provide a flat surface.

The semiconductor layer is located on the buffer layer BL. The semiconductor layer may include the first active layer ACT1 of the first transistor T1 and the second active layer ACT2 of the second transistor T2. The first active layer ACT1 and the second active layer ACT2 may partially overlap the first gate electrode G1 and the second gate electrode G2 of a second conductive layer, respectively, which will be described later.

The semiconductor layer may include polycrystalline silicon, monocrystalline silicon, an oxide semiconductor, etc. In other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc.

Although only one first transistor T1 is located in the sub-pixel SPXn of the display device 10 in the drawing, the present disclosure is not limited thereto. A larger number of transistors may be included in the display device 10.

A first gate insulator GI is located on the semiconductor layer and the buffer layer BL in the display area DPA. The first gate insulator GI may be omitted from the pad area PDA. It may work as a gate insulating film of each of the transistors T1 and T2. Although the first gate insulator GI is located entirely on the buffer layer BL in the example shown in the drawings, the present disclosure is not limited thereto. In some embodiments, the first gate insulator GI is patterned together with the gate electrodes G1 and G2 of the second conductive layer to be described later, and is partially located between the second conductive layer and the active layers ACT1 and ACT2 of the semiconductor layer.

The second conductive layer is located on the first gate insulator GI. The second conductive layer may include a first gate electrode G1 of the first transistor T1, and a second gate electrode G2 of the second transistor T2. The first gate electrode G1 may overlap a channel region of the first active layer ACT1 in the third direction DR3, which is the thickness direction. The second gate electrode G2 may overlap a channel region of the second active layer ACT2 in the third direction DR3, which is the thickness direction. The second conductive layer may further include an electrode of a storage capacitor.

A first interlayer dielectric layer IL1 is located on the second conductive layer. The first interlayer dielectric layer IL1 may work as an insulating film between the second conductive layer and other layers located thereon, and may protect the second conductive layer.

The third conductive layer is located on the first interlayer dielectric layer IL1. The third conductive layer may include the first voltage line VL1 and the second voltage line VL2 located in the display area DPA, a first conductive pattern CDP1, and the source electrodes S1 and S2 and drain electrodes D1 and D2 of the transistors T1 and T2. The third conductive layer may further include the other electrode of the storage capacitor.

A high-level voltage (or a first supply voltage) may be applied to the first voltage line VL1 to be transmitted to the first electrode RME1, and a low-level voltage (or a second supply voltage) may be applied to the second voltage line VL2 to be transmitted to the second electrode RME2. A portion of the first voltage line VL1 may be in contact with the first active layer ACT1 of the first transistor T1 through a contact hole penetrating the first interlayer dielectric layer IL1 and the first gate insulator GI. The first voltage line VL1 may work as the first drain electrode D1 of the first transistor T1. The second voltage line VL2 may be directly connected to the second electrode RME2 to be described later.

The first conductive pattern CDP1 may be in contact with the first active layer ACT1 of the first transistor T1 through a contact hole penetrating the first interlayer dielectric layer IL1 and the first gate insulator GI. The first conductive pattern CDP1 may be in contact with the bottom metal layer BML through another contact hole. The first conductive pattern CD1 may work as a first source electrode S1 of the first transistor T1. In addition, the first conductive pattern CDP1 may be connected to a first electrode RME1 or to a first connection electrode CNE1 to be described later. The first transistor T1 may transfer the first supply voltage applied from the first voltage line VL1 to the first electrode RME1 or the first connection electrode CNE1.

The second source electrode S2 and the second drain electrode D2 may be in contact with the second active layer ACT2 of the second transistor T2 through contact holes penetrating the first interlayer dielectric layer IL1 and the first gate insulator GI. The second transistor T2 may be one of the switching transistors described above with reference to FIG. 3. The second transistor T2 may transmit a signal applied from the data line DTL of FIG. 3 to the first transistor T1, or may transmit a signal applied from the initialization voltage line VIL of FIG. 3 to the other electrode of the storage capacitor.

A first passivation layer PV1 is located over the third conductive layer. The first passivation layer PV1 may work as an insulating film between the third conductive layer and other layers, and may protect the third conductive layer.

The buffer layer BL, the first gate insulator GI, the first interlayer dielectric layer IL1, and the first passivation layer PV1 may be made up of multiple inorganic layers alternately stacked on one another. For example, the buffer layer BL, the first gate insulator GI, the first interlayer dielectric layer IL1, and the first passivation layer PV1 may be made up of a double layer in which inorganic layers including at least one of silicon oxide (SiOx), silicon nitride (SiNx), or silicon oxynitride (SiON) are stacked on one another, or multiple layers in which they are alternately stacked on one another. It is, however, to be understood that the present disclosure is not limited thereto. The buffer layer BL, the first gate insulator GI, the first interlayer dielectric layer IL1 and the first passivation layer PV1 may be made up of a single inorganic layer including the above-described insulating material. In addition, in some embodiments, the first interlayer dielectric layer IL1 may be made of an organic insulating material, such as polyimide (PI).

A via layer VIA is located on the third conductive layer in the display area DPA. The via layer VIA may include an organic insulating material (e.g., an organic insulating material, such as polyimide (PI)) to provide a flat surface over the underlying conductive layers having different heights. It should be noted that the via layer VIA may be eliminated in some implementations.

The display device 10 may include the bank patterns BP1 and BP2, a plurality of electrodes RME (RME1 and RME2), the bank layer BNL, the light-emitting elements ED, and the connection electrodes CNE (CNE1 and CNE2), as a display element layer located on the via layer VIA. In addition, the display device 10 may include a plurality of passivation layers PAS1, PAS2, and PAS3 located on the via layer VIA.

The bank patterns BP1 and BP2 may be located in the emission area EMA of each sub-pixel SPX. Each of the bank patterns BP1 and BP2 may have a shape that has a constant width in the second direction DR2, and that is extended in the first direction DR1.

For example, the bank patterns BP1 and BP2 may include a first bank pattern BP1 and a second bank pattern BP2 that are spaced apart from each other in the second direction DR2 in the emission area EMA of each sub-pixel SPXn. The first bank pattern BP1 may be located on the left side of the center of the emission area EMA that is one side in the second direction DR2, and the second bank pattern BP2 may be spaced apart from the first bank pattern BP1, and may be located on the right side of the center of the emission area EMA that is the opposite side in the second direction DR2. The first bank pattern BP1 and the second bank pattern BP2 may be alternately arranged along the second direction DR2, and may be located in an island-like pattern in the display area DPA. The plurality of light-emitting elements ED may be located between the first bank pattern BP1 and the second bank pattern BP2.

The length of the first bank pattern BP1 may be equal to the length of the second bank pattern BP2 in the first direction DR1. The lengths of the first bank pattern BP1 and the second bank pattern BP2 may be less than the length of the emission area EMA surrounded by the bank layer BNL in the first direction DR1. The first bank pattern BP1 and the second bank pattern BP2 may be spaced apart from a portion of the bank layer BNL that is extended in the second direction DR2. It should be understood, however, that the present disclosure is not limited thereto. The bank patterns BP1 and BP2 may be integrated with the bank layer BNL, or may partially overlap with a portion of the bank layer BNL that is extended in the second direction DR2. In this instance, the lengths of the bank patterns BP1 and BP2 in the first direction DR1 may be equal to or greater than the length of the emission area EMA surrounded by the bank layer BNL in the first direction DR1.

The first bank pattern BP1 and the second bank pattern BP2 may have the same width in the second direction DR2. It should be understood, however, that the present disclosure is not limited thereto. They may have different widths. For example, one of the bank patterns may have a greater width than the other one, and the larger bank pattern may be located across the emission areas EMA of different sub-pixels SPXn adjacent to each other in the second direction DR2. In this instance, when the bank patterns are located across the emission areas EMA, portions of the bank layer BNL extended in the first direction DR1 may overlap the second bank pattern BP2 in the thickness direction. Although two bank patterns BP1 and BP2 are located in each sub-pixel SPXn and have to have the same width in the example shown in the drawings, the present disclosure is not limited thereto. The number and shape of the bank patterns BP1 and BP2 may vary depending on the number or arrangement structure of the electrodes RME.

The plurality of bank patterns BP1 and BP2 may be located on the via layer VIA. For example, the bank patterns BP1 and BP2 may be located directly on the via layer VIA, and may have a structure that at least partly protrudes from the upper surface of the via layer VIA. The protruding portions of the bank patterns BP1 and BP2 may have inclined or bent side surfaces. The lights emitted from the light-emitting elements ED may be reflected by the electrodes RME located on the bank patterns BP1 and BP2 so that the lights may exit toward the upper side of the via layer VIA. Unlike that shown in the drawings, the bank patterns BP1 and BP2 may have a semi-circular or semi-elliptical shape with a curved outer surface in the cross-sectional view. The bank patterns BP1 and BP2 may include, but are not limited to, an organic insulating material, such as polyimide (PI).

The plurality of electrodes RME (RME1 and RME2) have a shape extended in one direction and are located in each of the sub-pixels SPXn. The plurality of electrodes RME1 and RME2 may extend in the first direction DR1 to be located in the emission area EMA and the subsidiary area SA of the sub-pixel SPXn, and they may be spaced apart from one another in the second direction DR2. The plurality of electrodes RME may be electrically connected to the light-emitting elements ED, which will be described later. It should be understood, however, that they may not be electrically connected to the light-emitting elements ED.

The display device 10 may include a first electrode RME1 and a second electrode RME2 located in each of the sub-pixels SPXn. The first electrode RME1 is located on the left side of the center of the emission area EMA, and the second electrode RME2 is spaced apart from the first electrode RME1 in the second direction DR2 and is located on the right side of the center of the emission area EMA. The first electrode RME1 may be located on the first bank pattern BP1, and the second electrode RME2 may be located on the second bank pattern BP2. The first electrode RME1 and the second electrode RME2 may extend beyond the bank layer BNL and may be partially located in the sub-pixel SPXn and the subsidiary area SA. The first electrode RME1 and the second electrode RME2 of a sub-pixel SPXn may be spaced apart from those of another sub-pixel SPXn at the separation region ROP located in the subsidiary area SA of one of the sub-pixels SPXn.

Although two electrodes RME are located in each sub-pixel SPXn and have a shape extended in the first direction DR1 in the drawings, but the present disclosure is not limited thereto. More than two electrodes RME may be located, or the electrodes RME may be partially bent and may have different widths at different positions.

The first electrode RME1 and the second electrode RME2 may be located on at least inclined side surfaces of the bank patterns BP1 and BP2. According to one or more embodiments of the present disclosure, the width of the plurality of electrodes RME measured in the second direction DR2 may be less than the width of the bank patterns BP1 and BP2 measured in the second direction DR2. The distance between the first electrode RME1 and the second electrode RME2 spaced apart from each other in the second direction DR2 may be less than the distance between the bank patterns BP1 and BP2. At least a portion of the first electrode RME1 and the second electrode RME2 may be located directly on the via layer VIA, so that they may be located on the same plane.

The light-emitting elements ED located between the bank patterns BP1 and BP2 may emit lights through both ends. The emitted lights may be directed to the electrodes RME located on the bank patterns BP1 and BP2. The portion of each of the electrodes RME that is located on the bank patterns BP1 and BP2 may reflect lights emitted from the light-emitting elements ED. The first electrodes RME1 and the second electrodes RME2 may cover the side surfaces of the bank patterns BP1 and BP2 on at least one side to reflect lights emitted from the light-emitting elements ED.

The respective electrodes RME may be in direct contact with the third conductive layer through the electrode contact holes CTD and CTS where it overlaps with the bank layer BNL between the emission area EMA and the subsidiary area SA. The first electrode contact hole CTD may be formed where the bank layer BNL and the first electrode RME1 overlap each other. The second electrode contact hole CTS may be formed where the bank layer BNL and the second electrode RME2 overlap each other. The first electrode RME1 may be in contact with the first conductive pattern CDP1 through the first electrode contact hole CTD penetrating through the via layer VIA and the first passivation layer PV1. The second electrode RME2 may be in contact with the second voltage line VL2 through the second electrode contact hole CTS penetrating through the via layer VIA and the first passivation layer PV1. The first electrode RME1 may be electrically connected to the first transistor T1 through the first conductive pattern CDP1 to receive the first supply voltage. The second electrode RME2 may be electrically connected to the second voltage line VL2 to receive the second supply voltage. It is, however, to be understood that the present disclosure is not limited thereto. According to one or more other embodiments, each of the electrodes RME1 and RME2 are not electrically connected to the voltage lines VL1 and VL2 of the third conductive layer and connection electrodes CNE to be described later may be directly connected to the third conductive layer.

Each of the electrodes RME may include a conductive material having a high reflectance. For example, the electrodes RME may include a metal, such as silver (Ag), copper (Cu) and aluminum (Al), or may include an alloy including aluminum (Al), nickel (Ni), lanthanum (La), or the like, or a stack of a metal layer, such as titanium (Ti), molybdenum (Mo) and niobium (Nb) and the alloy. In some embodiments, the electrodes RME may be made up of a double- or multi-layer in which an alloy containing aluminum (Al) and at least one metal layer made of titanium (Ti), molybdenum (Mo), or niobium (Nb) are stacked on one another.

It is, however, to be understood that the present disclosure is not limited thereto. The electrodes RME may further include a transparent conductive material. For example, each of the electrodes RME may include a material, such as ITO, IZO, and ITZO. In some embodiments, each of the electrodes RME1 and RME2 may have a structure in which one or more layers of a transparent conductive material and one or more metal layers having high reflectivity are stacked on one another, or may be made up of a single layer including them. For example, each of the electrodes RME may have a stack structure, such as ITO/Ag/ITO/, ITO/Ag/IZO, or ITO/Ag/ITZO/IZO. The electrodes RME may be electrically connected to the light-emitting elements ED, and may reflect some of the lights emitted from the light-emitting elements ED toward the upper side of the first substrate SUB.

The first passivation layer PAS1 may be located on the front surface of the display area DPA, and may be located on the via layer VIA and the plurality of electrodes RME. The first passivation layer PAS1 can protect the plurality of electrodes RME, and can insulate different electrodes RME from each other. As the first passivation layer PAS1 is located to cover the electrodes RME before the bank layer BNL is formed, it is possible to reduce or prevent the likelihood of the electrode RME being damaged during the process of forming the bank layer BNL. In addition, the first passivation layer PAS1 can also reduce or prevent the likelihood that the light-emitting elements ED located thereon are brought into contact with other elements and damaged.

In one or more embodiments, the first passivation layer PAS1 may have a step so that a portion of the upper surface is recessed between the electrodes RME spaced apart from one another in the second direction DR2. The light-emitting elements ED may be located on the upper surface of the step of the first passivation layer PAS1, and a space may be formed between the light-emitting elements ED and the first passivation layer PAS1.

Incidentally, in the space formed between the light-emitting elements ED and the first passivation layer PAS1, a short circuit may be formed by residues of the connection electrodes CNE spaced apart from each other with the light-emitting elements ED therebetween during the process of forming the connection electrodes CNE to be described later. That is to say, the first connection electrode CNE1 and the second connection electrode CNE2 may be electrically connected to each other to result in a short-circuit failure in the space under the light-emitting elements ED.

According to one or more embodiments of the present disclosure, there are included a protrusion PRU located on the via layer VIA, and an insulating pattern IPL located on the protrusion PRU, so that it is possible to segregate the space under the light-emitting elements ED to thereby reduce or prevent the likelihood of the connection electrodes CNE forming a short circuit.

For example, the via layer VIA may include the protrusion PRU. The protrusion PRU may be a portion protruding toward the light-emitting elements ED from the surface of the via layer VIA. The protrusion PRU and the via layer VIA may be formed as a single body (e.g., the protrusion PRU may be a portion of the via layer VIA). The protrusion PRU may overlap with the light-emitting elements ED in plan view, and can reduce a step height of the first passivation layer PAS1 under the light-emitting elements ED.

The protrusion PRU may be located in the emission area EMA and may not overlap with the bank layer BNL. The protrusion PRU may be located between the first electrode RME1 and the second electrode RME2, and may be spaced apart from the first electrode RME1 and the second electrode RME2. It should be understood, however, that the present disclosure is not limited thereto. The protrusion PRU may be located in contact with the first electrode RME1 or the second electrode RME2, or may be in contact with the first electrode RME1 and the second electrode RME2. A thickness T1 of the protrusion PRU may be less than a thickness T2 of the first electrode RME1 or the second electrode RME2.

The insulating pattern IPL may be located on the protrusion PRU. The insulating pattern IPL may overlap with the light-emitting elements ED in plan view, and can reduce the step height of the first passivation layer PAS1 under the light-emitting elements ED. The insulating pattern IPL may be located between the first electrode RME1 and the second electrode RME2, and may be spaced apart from the first electrode RME1 and the second electrode RME2.

The insulating pattern IPL may include an inorganic insulating material. For example, the insulating pattern IPL may be one of silicon oxide (SiOx), silicon nitride (SiNx), and silicon oxynitride (SiOxNy). If the insulating pattern IPL includes a conductive material, the adjacent first electrode RME1 and the second electrode RME2 may form a short circuit by the insulating pattern IPL. If the first passivation layer PAS1 is not even, the connection electrodes CNE located on the insulating pattern IPL may form a short circuit by the insulating pattern IPL. Accordingly, the insulating pattern IPL may include an inorganic insulating material.

A width W1 of the insulating pattern IPL in plan view may be greater than a width W2 of the protrusion PRU of the via layer VIA. The insulating pattern IPL may work as a hard mask for forming the protrusion PRU of the via layer VIA, as will be described later. That is to say, after the insulating pattern IPL is formed on the via layer VIA, the thickness of the via layer VIA is etched using the insulating pattern IPL as a mask to form the protrusion PRU of the via layer VIA. Accordingly, the via layer VIA made of the organic material may be formed in an under-cut shape underneath the insulating pattern IPL so that the width W1 of the insulating pattern IPL is larger than the width of the protrusion PRU.

According to one or more embodiments corresponding to FIG. 7, the side surfaces of the insulating pattern IPL may protrude outwardly more than the side surfaces of the protrusion PRU. The side surfaces of the protrusion PRU may be perpendicular to the surface of the via layer VIA in the third direction DR3.

According to one or more other embodiments of FIG. 8, the side surfaced of the protrusion PRU may be formed as inclined surfaces with an angle (e.g., a predetermined angle). The side surfaces of the protrusion PRU may have a positive taper shape. In this instance, the width of the upper surface of the protrusion PRU may be less than the width of the lower surface of the protrusion PRU.

Each of the width W1 of the insulating pattern IPL and the width W2 of the protrusion PRU may be less than a distance DD between the first electrode RME1 and the second electrode RME2. The insulating pattern IPL and the protrusion PRU may be located adjacent to one of the first electrode RME1 and the second electrode RME2. It is desired that the insulating pattern IPL and the protrusion PRU are located generally at the center between the first electrode RME1 and the second electrode RME2 considering a process tolerance of the first electrode RME1 and the second electrode RME2 in subsequent processes. For example, it may be suitable that the distance between the left end of the insulating pattern IPL and the first electrode RME1 may be substantially equal to the distance between the right end of the insulating pattern IPL and the second electrode RME2.

As described above, the protrusion PRU of the via layer VIA and the insulating pattern IPL can reduce the step height of the first passivation layer PAS1 under the light-emitting elements ED so that the space between the light-emitting elements ED and the first passivation layer PAS1 can be eliminated. To eliminate the space between the light-emitting elements ED and the first passivation layer PAS1, the sum of the thickness T1 of the protrusion PRU of the via layer VIA and the thickness T3 of the insulating pattern IPL may be equal to the thickness T2 of the first electrode RME1 or the second electrode RME2. That is to say, the space between the light-emitting elements ED and the first passivation layer PAS1 can be eliminated as the structures under the first passivation layer PAS1 have the uniform thickness under the light-emitting elements ED. In one or more other embodiments, the thickness T1 of the protrusion PRU and the thickness T3 of the insulating pattern IPL may be less than the thickness T2 of the first electrode RME1 or the second electrode RME2.

It should be understood, however, that the present disclosure is not limited thereto. The sum of the thickness T1 of the protrusion PRU of the via layer VIA and the thickness T3 of the insulating pattern IPL may be substantially equal to the thickness T2 of the first electrode RME1 or the second electrode RME2. As used herein, substantially equal refers to quantities, values, or dimensions that are within manufacturing variance or tolerance ranges of being perfectly equal. Substantially equal dimensions, for example, may be planned as ideally equal but normal manufacturing tolerances may cause the resulting dimensions to vary by 10%-20% for different pieces.

The protrusion PRU of the via layer VIA and the insulating pattern IPL are formed under the first passivation layer PAS1 where they overlap with the light-emitting elements ED, so that the space between the light-emitting elements ED and the first passivation layer PAS1 can be eliminated. Accordingly, the upper surface of the first passivation layer PAS1 and the lower surfaces of the light-emitting elements ED can be in contact with each other above the protrusion PRU of the via layer VIA and the insulating pattern IPL. That is to say, by eliminating the space between the light-emitting elements ED and the first passivation layer PAS1, it is possible to reduce or prevent the likelihood of the first connection electrode CNE1 and the second connection electrode CNE2 forming a short circuit, thereby reducing or preventing the likelihood of a short-circuit failure.

The bank layer BNL may be located on the first passivation layer PAS1. The bank layer BNL may include portions extended in the first direction DR1 and the second direction DR2, and may surround each of the sub-pixels SPXn. The bank layer BNL may surround the emission area EMA and the subsidiary area SA of each of the sub-pixels SPXn to distinguish between them, and may surround the border of the display area DPA to distinguish between the display area DPA and the non-display area NDA. The bank layer BNL may be located in the entire display area DPA (e.g., may cover an entirety of the display DPA) to form a lattice pattern. The area opened by the bank layer BNL in the display area DPA may be the emission area EMA and the subsidiary area SA.

The bank layer BNL may have a height (e.g., predetermined height) that is similar to the bank patterns BP1 and BP2. In some embodiments, the top surface of the bank layer BNL may have a height that is higher than that of the bank patterns BP1 and BP2, and the thickness thereof may be equal to or greater than the thicknesses of the bank patterns BP1 and BP2. The bank layer BNL can reduce or prevent the likelihood of an ink overflowing into adjacent sub-pixels SPXn during an inkjet printing process of the process of fabricating the display device 10. The bank layer BNL may include an organic insulating material, such as polyimide, like the bank patterns BP1 and BP2.

The plurality of light-emitting elements ED may be located in the emission area EMA. The light-emitting elements ED may be located between the bank patterns BP1 and BP2 and may be spaced apart from one another in the first direction DR1. According to one or more embodiments of the present disclosure, the plurality of light-emitting elements ED may have a shape extended in one direction, and the ends of the light-emitting elements ED may be located on respective electrodes RME. The length of the light-emitting elements ED may be larger than the distance between the electrodes RME spaced apart from each other in the second direction DR2. The direction in which the light-emitting elements ED are generally extended may be perpendicular to the first direction DR1 in which the electrodes RME are extended. It is, however, to be understood that the present disclosure is not limited thereto. The direction in which the light-emitting elements ED are extended may face the second direction DR2 or a direction extending obliquely thereto.

The light-emitting elements ED may be located on the first passivation layer PAS1. The light-emitting elements ED may extend in a direction, and the direction may be parallel to the upper surface of the first substrate SUB. As will be described later, the light-emitting elements ED may include a plurality of semiconductor layers arranged in the extended direction. The plurality of semiconductor layers may be sequentially arranged along a direction parallel to the upper surface of the first substrate SUB. It should be understood, however, that the present disclosure is not limited thereto. When the light-emitting elements ED have a different structure, a plurality of semiconductor layers may be located in a direction perpendicular to the first substrate SUB.

The light-emitting elements ED located in each of the sub-pixels SPXn may emit light of different wavelength bands depending on the material of the semiconductor layer. It is, however, to be understood that the present disclosure is not limited thereto. The light-emitting elements ED located in each of the sub-pixels SPXn may include the semiconductor layers made of the same material, and may emit light of the same color.

The light-emitting elements ED may be electrically connected to the electrodes RME and the conductive layers under the via layer VIA in contact with the connection electrodes CNE (CNE1 and CNE2), and an electric signal may be applied so that light of a corresponding wavelength range can be emitted.

The second passivation layer PAS2 may be located on the light-emitting elements ED and the first passivation layer PAS1. The second passivation layer PAS2 may extend in the first direction DR1 between the bank patterns BP1 and BP2, and may include a pattern portion located on the plurality of light-emitting elements ED. The pattern portion may partially surround the outer surface of the light-emitting elements ED, and may not cover both sides or both ends of the light-emitting elements ED. The pattern portion may form a linear or island pattern in each sub-pixel SPXn in plan view. The pattern portion of the second passivation layer PAS2 can protect the light-emitting elements ED and can fix the light-emitting elements ED during the process of fabricating the display device 10.

The plurality of connection electrodes CNE (CNE1 and CNE2) may be located on the plurality of electrodes RME and the bank patterns BP1 and BP2. The plurality of connection electrodes CNE may each have a shape extended in one direction, and may be spaced apart from one another. The connection electrodes CNE may be in contact with the light-emitting elements ED, and may be electrically connected to the third conductive layer.

The connection electrodes CNE may include a first connection electrode CNE1 and a second connection electrode CNE2 located in each sub-pixel SPXn. The first connection electrode CNE1 may have a shape extended in the first direction DR1, and may be located on the first electrode RME1 or the first bank pattern BP1. The first connection electrode CNE1 may partially overlap with the first electrode RME1, and may be located from the emission area EMA to the subsidiary area SA beyond the bank layer BNL. The second connection electrode CNE2 may have a shape extended in the first direction DR1, and may be located on the second electrode RME2 or the second bank pattern BP2. The second connection electrode CNE2 may partially overlap with the second electrode RME2, and may be located from the emission area EMA to the subsidiary area SA beyond the bank layer BNL. The first connection electrode CNE1 and the second connection electrodes CNE2 may be in contact with the light-emitting elements ED, and may be electrically connected to the electrodes RME or a conductive layer thereunder.

For example, the first connection electrode CNE1 and the second connection electrode CNE2 may be located on the side surfaces of the second passivation layer PAS2, respectively, and may be in contact with the light-emitting elements ED. The first connection electrode CNE1 may partially overlap with the first electrode RME1, and may be in contact with first ends of the light-emitting elements ED. The second connection electrode CNE2 may partially overlap with the second electrode RME2, and may be in contact with second ends of the light-emitting elements ED. The plurality of connection electrodes CNE are located across the emission area EMA and the subsidiary area SA. A portion of each of the connection electrodes CNE that is located in the emission area EMA may be in contact with the light-emitting elements ED, and a part thereof that is located in the subsidiary area SA may be electrically connected to the third conductive layer.

In the display device, each of the connection electrodes CNE may be respectively in contact with the electrodes RME through the contacts CT1 and CT2 located in the subsidiary area SA. The first connection electrode CNE1 may be in contact with the first electrode RME1 through a first contact CT1 penetrating the first passivation layer PAS1 in the subsidiary area SA. The second connection electrode CNE2 may be in contact with the second electrode RME2 through a second contact CT2 penetrating the first passivation layer PAS1 in the subsidiary area SA. The connection electrodes CNE may be electrically connected to the third conductive layer through the respective electrodes RME. The first connection electrode CNE1 may be electrically connected to the first transistor T1 to apply the first supply voltage, and the second connection electrode CNE2 may be electrically connected to the second voltage line VL2 to apply the second supply voltage. Each of the connection electrodes CNE may be in contact with the light-emitting elements ED in the emission area EMA to transmit the supply voltage to the light-emitting elements ED.

It is, however, to be understood that the present disclosure is not limited thereto. In some embodiments, the plurality of connection electrodes CNE may be in direct contact with the third conductive layer, or may be electrically connected to the third conductive layer through other patterns than the electrodes RME.

The connection electrodes CNE may include a conductive material. For example, the connection electrodes CNE may include ITO, IZO, ITZO, aluminum (Al), etc. For example, the connection electrodes CNE may include a transparent conductive material, and lights emitted from the light-emitting elements ED may transmit the connection electrodes CNE to exit.

Another insulating layer may be further located on the first connection electrode CNE1, the second connection electrode CNE2, and the second passivation layer PAS2. The insulating layer can protect the elements located on the first substrate SUB against the external environment.

Each of the first passivation layer PAS1 and the second passivation layer PAS2 may include an inorganic insulating material or an organic insulating material. For example, each of the first passivation layer PAS1 and the second passivation layer PAS2 may include an inorganic insulating material, or the first passivation layer PAS1 may include an inorganic insulating material while the second passivation layer PAS2 may include an organic insulating material. Either both or one of the first insulating layer PAS1 and the second insulating layer PAS2 may be formed in a structure in which insulating layers are alternately or repeatedly stacked on one another. According to one or more embodiments of the present disclosure, each of the first passivation layer PAS1 and the second passivation layer PAS2 may be made of one of silicon oxide (SiOx), silicon nitride (SiNx), and silicon oxynitride (SiOxNy). The first passivation layer PAS1 and the second passivation layer PAS2 may be made of the same material. Alternatively, some of them may be made of the same material while the other(s) may be made of different material(s), or they may be made of different materials.

Figure 10:
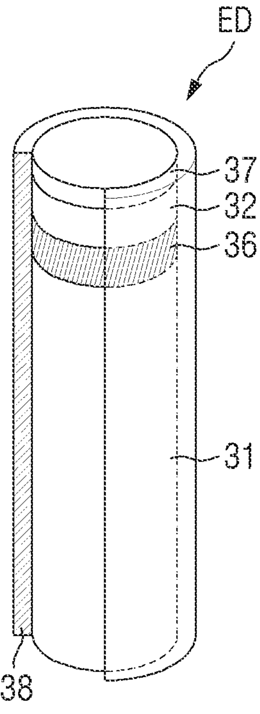
FIG. 10 is a view showing a light-emitting element according to one or more embodiments of the present disclosure.

FIG. 10 is a view showing a light-emitting element according to one or more embodiments of the present disclosure.

Referring to FIG. 10, a light-emitting element ED may be a light-emitting diode. For example, the light-emitting element ED may have a size from nanometers to micrometers, and may be an inorganic light-emitting diode made of an inorganic material. The light-emitting element ED may be aligned between two electrodes facing each other as polarities are created by forming an electric field in a corresponding direction between the two electrodes.

The light-emitting element ED according to one or more embodiments may have a shape extended in one direction. The light-emitting element ED may have a shape of a cylinder, a rod, a wire, a tube, etc. It is to be understood that the shape of the light-emitting element ED is not limited thereto. The light-emitting element ED may have a variety of shapes including a polygonal column shape, such as a cube, a cuboid and a hexagonal column, or a shape that is extended in a direction with partially inclined outer surfaces.

The light-emitting element ED may include semiconductor layers doped with a dopant of a conductive type (e.g., p-type or n-type). The semiconductor layers may emit light of a certain wavelength band by transmitting an electric signal applied from an external power source. The light-emitting diode ED may include a first semiconductor layer 31, a second semiconductor layer 32, an emissive layer 36, an electrode layer 37, and an insulating film 38.

The first semiconductor layer 31 may be an n-type semiconductor. The first semiconductor layer 31 may include a semiconductor material having the chemical formula $Al_xGa_yIn_{1-x-y}N$ (0≤x≤, 0≤y≤1, 0≤x+y≤1). For example, the first semiconductor layer 31 may be one or more of AlGaInN, GaN, AlGaN, InGaN, AlN, or InN doped with n-type dopant. The n-type dopant doped into the first semiconductor layer 31 may be Si, Ge, Se, Sn, etc.

The second semiconductor layer 32 is located above the first semiconductor layer 31 with the emissive layer 36 therebetween. The second semiconductor layer 32 may be a p-type semiconductor, and may include a semiconductor material having the chemical formula $Al_xGa_yIn_{1-x-y}N$ (0≤x≤1, 0≤y≤1, 0≤x+y≤1). For example, the second semiconductor layer 32 may be one or more of AlGaInN, GaN, AlGaN, InGaN, AlN, or InN doped with p-type dopant. The p-type dopant doped into the second semiconductor layer 32 may be Mg, Zn, Ca, Ba, etc.

Although each of the first semiconductor layer 31 and the second semiconductor layer 32 is implemented as a signal layer in the drawings, the present disclosure is not limited thereto. Depending on the material of the emissive layer 36, the first semiconductor layer 31 and the second semiconductor layer 32 may further include a larger number of layers (e.g., a clad layer or a tensile strain barrier reducing (TSBR) layer). For example, the light-emitting elements ED may further include another semiconductor layer located between the first semiconductor layer 31 and the emissive layer 36, or between the second semiconductor layer 32 and the emissive layer 36. The semiconductor layer located between the first semiconductor layer 31 and the emissive layer 36 may be one or more of AlGaInN, GaN, AlGaN, InGaN, AlN, InN, or SLs doped with an n-type dopant. The semiconductor layer located between the second semiconductor layer 32 and the emissive layer 36 may be one or more of AlGaInN, GaN, AlGaN, InGaN, AlN, or InN doped with a p-type dopant.

The emissive layer 36 is located between the first semiconductor layer 31 and the second semiconductor layer 32. The emissive layer 36 may include a material having a single or multiple quantum well structure. When the emissive layer 36 includes a material having the multiple quantum well structure, the structure may include quantum layers and well layers alternately stacked on one another. The emissive layer 36 may emit light as electron-hole pairs are combined therein in response to an electrical signal applied through the first semiconductor layer 31 and the second semiconductor layer 32. The emissive layer 36 may include a material, such as AlGaN, AlGaInN, and InGaN. For example, when the emissive layer 36 has a multi-quantum well structure in which quantum layers and well layers are alternately stacked on one another, the quantum layers may include AlGaN or AlGaInN, and the well layers may include a material, such as GaN or AlGaN.

The emissive layer 36 may have a structure in which a semiconductor material having a large band gap energy and a semiconductor material having a small band gap energy are alternately stacked on one another, and may include other Group Ill to Group V semiconductor materials depending on the wavelength range of the emitted light. Accordingly, the light emitted from the emissive layer 36 is not limited to the light of the blue wavelength band. The emissive layer 36 may emit light of red or green wavelength band in some implementations.

The electrode layer 37 may be an ohmic connection electrode. It is, however, to be understood that the present disclosure is not limited thereto. The electrode layer 37 may be a Schottky connection electrode. The light-emitting element ED may include at least one electrode layer 37. The light-emitting element ED may include one or more electrode layers 37. It is, however, to be understood that the present disclosure is not limited thereto. The electrode layer 37 may be eliminated.

The electrode layer 37 can reduce the resistance between the light-emitting element ED and the electrodes or the connection electrodes when the light-emitting element ED is electrically connected to the electrodes or to the connection electrodes in the display device 10. The electrode layer 37 may include a metal having conductivity. For example, the electrode layer 37 may include at least one of aluminum (Al), titanium (Ti), indium (In), gold (Au), silver (Ag), ITO, IZO, or ITZO.

The insulating film 38 is located to surround the outer surfaces of the plurality of semiconductor layers and electrode layers described above. For example, the insulating film 38 may surround at least the outer surface of the emissive layer 36, with both ends of the light-emitting element ED in the longitudinal direction exposed. In addition, a portion of the upper surface of the insulating film 38 may be rounded in cross section, which is adjacent to at least one of the ends of the light-emitting element ED.

The insulating film 38 may include materials having insulating properties, for example, at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx). Although the insulating film 38 is formed as a single layer in the drawings, the present disclosure is not limited thereto. In some embodiments, the insulating film 38 may be made up of a multilayer structure in which multiple layers are stacked on one another.

The insulating film 38 can protect the semiconductor layers and the electrode layer of the light-emitting elements ED. The insulating film 30 can reduce or prevent the likelihood of an electrical short-circuit that may occur in the emissive layer 36 if it comes in direct contact with an electrode through which an electric signal is transmitted to the light-emitting diode ED. In addition, the insulating film 38 can reduce or prevent a decrease in luminous efficiency.

In addition, the outer surface of the insulating film 38 may be subjected to surface treatment. The light-emitting elements ED may be dispersed in an ink, and the ink may be sprayed onto the electrode. In doing so, a surface treatment may be applied to the insulating film 38 so that it becomes hydrophobic or hydrophilic in order to keep the light-emitting elements ED dispersed in the ink from being aggregated with one another.

Figure 12:
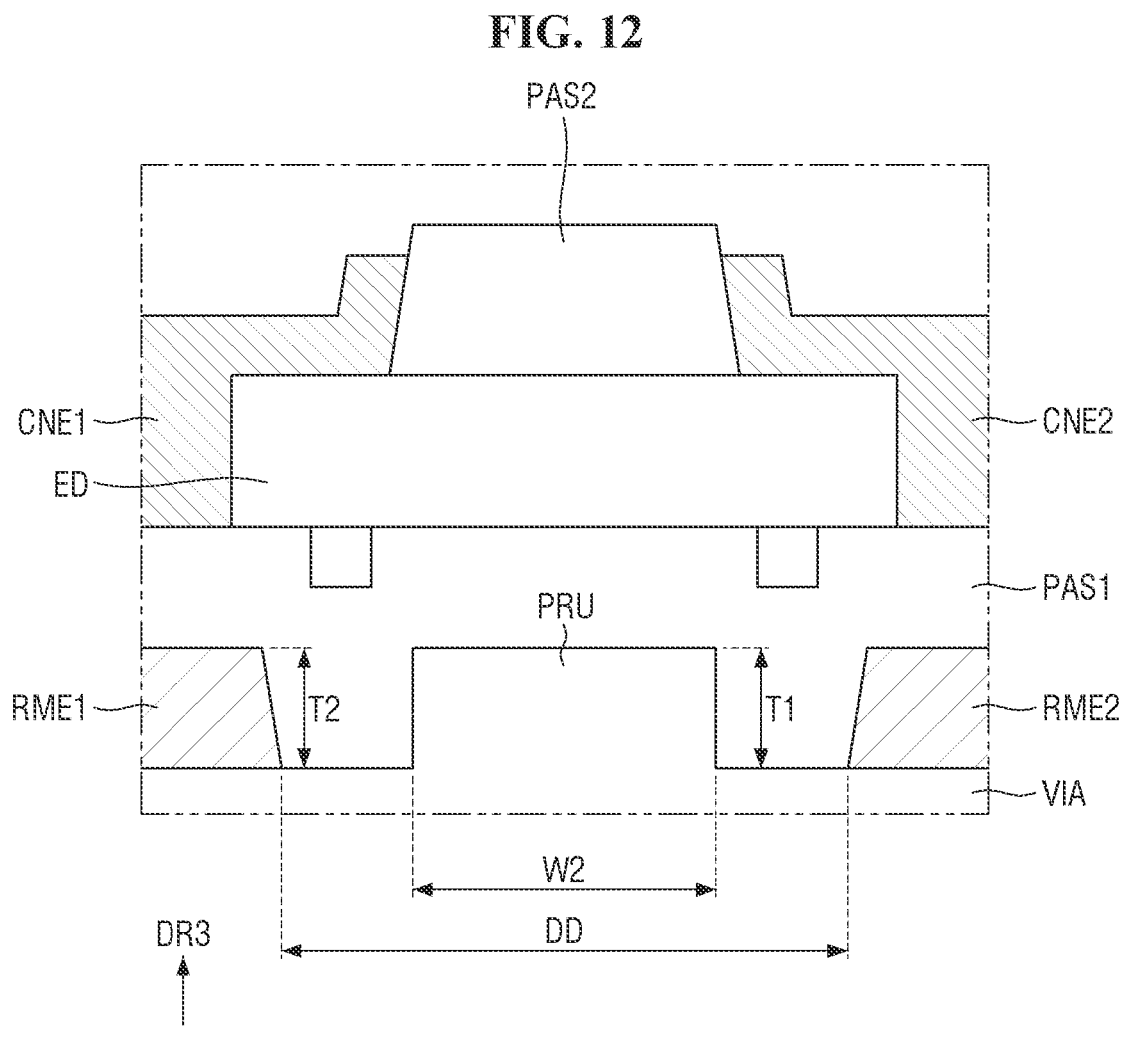

FIG. 11 is a cross-sectional view showing a display device according to one or more other embodiments of the present disclosure. FIG. 12 is an enlarged view of a portion of FIG. 11.

FIG. 11 shows a cross section showing both ends of a light-emitting element ED and electrode contact holes CTD and CTS in a first sub-pixel SPX1. FIG. 12 shows the protrusion PRU of the via layer VIA.

One or more embodiments corresponding to FIGS. 11 and 12 are substantially identical to one or more embodiments corresponding to FIGS. 5 to 9 except that an insulating pattern IPL is eliminated in a display device 10. In the following description, the description will focus on the difference and the redundant description will be omitted.

A protrusion PRU is located on the via layer VIA, so that it is possible to segregate the space between the light-emitting elements ED and the first passivation layer PAS1 to thereby reduce or prevent the likelihood of the connection electrodes CNE forming a short circuit.

For example, the via layer VIA may include the protrusion PRU. The protrusion PRU may overlap with the light-emitting elements ED in plan view, and can reduce a step height of the first passivation layer PAS1 under the light-emitting elements ED. The protrusion PRU may be located between the first electrode RME1 and the second electrode RME2, and may be spaced apart from the first electrode RME1 and the second electrode RME2.

The protrusion PRU of the via layer VIA can reduce the step height of the first passivation layer PAS1 under the light-emitting elements ED so that the space between the light-emitting elements ED and the first passivation layer PAS1 can be eliminated. To eliminate the space between the light-emitting elements ED and the first passivation layer PAS1, the thickness T1 of the protrusion PRU of the via layer VIA may be equal to the thickness T2 of the first electrode RME1 or the second electrode RME2. That is to say, the space between the light-emitting elements ED and the first passivation layer PAS1 can be reduced or eliminated as the structures under the first passivation layer PAS1 have the uniform thickness under the light-emitting elements ED.

The thickness T1 of the protrusion PRU may be substantially equal to the thickness T2 of the first electrode RME1 or the second electrode RME2. According to one or more embodiments of the present disclosure, the thickness T1 of the protrusion PRU may be substantially equal to the thickness T2 of the first electrode RME1 or the second electrode RME2. According to one or more other embodiments of the present disclosure, the thickness T1 of the protrusion PRU may be less than or greater than the thickness T2 of the first electrode RME1 or the second electrode RME2. For example, the thickness T1 of the protrusion PRU of the via layer VIA may have variations within 10% of the thickness T2 of the first electrode RME1 or the second electrode RME2. In addition, the width W2 of the protrusion PRU may be less than the distance DD between the first electrode RME1 and the second electrode RME2.

The protrusion PRU of the via layer VIA is formed under the first passivation layer PAS1 where they overlap with the light-emitting elements ED, so that the space between the light-emitting elements ED and the first passivation layer PAS1 can be eliminated. Accordingly, the upper surface of the first passivation layer PAS1 and the lower surfaces of the light-emitting elements ED can be in contact with each other above the protrusion PRU of the via layer VIA. That is to say, by reducing or eliminating the space between the light-emitting elements ED and the first passivation layer PAS1, it is possible to reduce or prevent the likelihood of the first connection electrode CNE1 and the second connection electrode CNE2 forming a short circuit, thereby preventing a short-circuit failure.

Hereinafter, a method of fabricating a display device according to one or more embodiments of the present disclosure will be described with reference to other drawings.

FIGS. 13 to 17 are cross-sectional views showing processing steps of a method of fabricating a display device according to one or more embodiments of the present disclosure. FIGS. 13 to 17 are cross-sectional views showing the structure of the layers of a sub-pixel SPXn of a display device 10 in the order that they are formed, which may be associated with a portion of the cross-sectional view of FIG. 5. Each of the layers may be formed by typical patterning process and inkjet printing process. In the following description, the formation order will be mainly described in each of the processes rather than the formation method.

Figure 13:
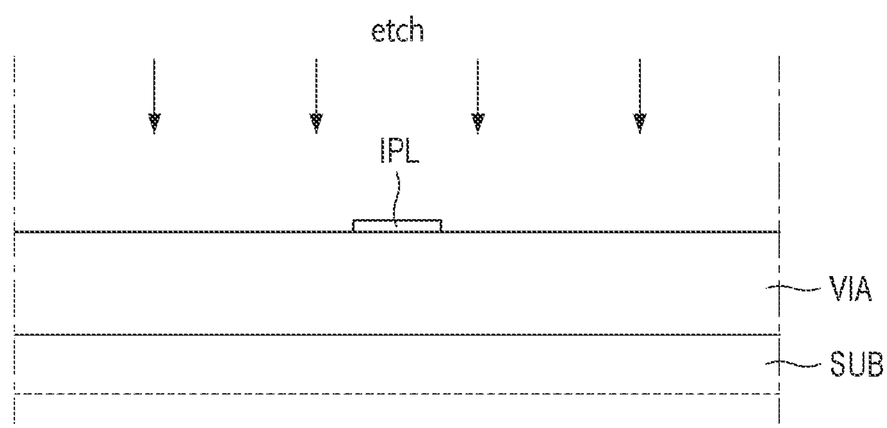
FIGS. 13 to 17 are cross-sectional views showing processing steps of a method of fabricating a display device according to one or more embodiments of the present disclosure.

Initially, referring to FIG. 13, a first substrate SUB is prepared, and a circuit layer is formed on the first substrate SUB. The circuit layer forms first to third conductive layers, a buffer layer, a first gate insulator, a first interlayer dielectric layer, and a first protect layer. The first to third conductive layers located on the first substrate SUB may be formed by depositing materials forming the layers, for example, metal materials, and patterning them using a mask. In addition, the buffer layer, the first gate insulator, the first interlayer dielectric layer, and the first protective layer located on the first substrate SUB may be formed by depositing materials forming the layers, for example, insulating materials, and patterning them using a mask if necessary.

Subsequently, a via layer VIA is formed on the first substrate SUB. The via layer VIA may be formed by applying an organic insulating material. Subsequently, an insulating pattern IPL is formed on the via layer VIA. The insulating pattern IPL may be formed by a patterning process using a mask after depositing an inorganic insulating material. The insulating pattern IPL may be formed to a thickness of approximately 1,000 Å.

Figure 14:
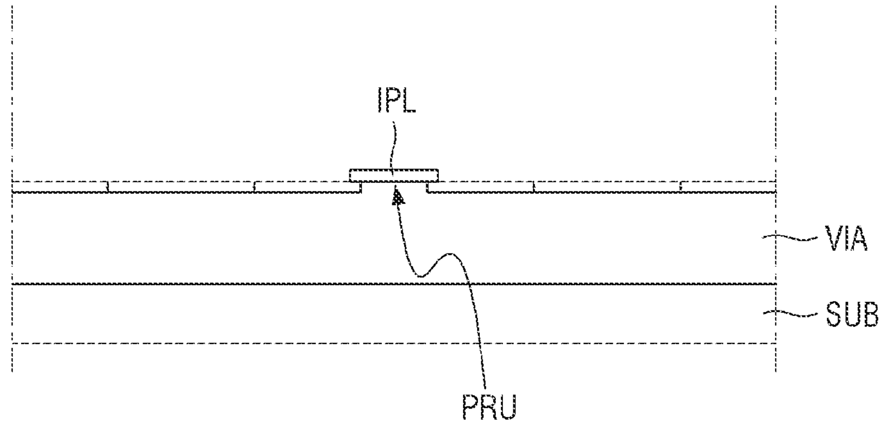

Subsequently, the via layer VIA is etched using the insulating pattern IPL as a mask to form the protrusion PRU as shown in FIG. 14. The insulating pattern IPL may work as a hard mask. The thickness of the via layer VIA, which is an organic insulating material, may be reduced by etching. A portion of the via layer VIA under the insulating pattern IPL is masked by the insulating pattern IPL so that the thickness is not reduced and remains there to be formed as the protrusion PRU. For example, the portion of the via layer VIA under the insulating pattern IPL may be over-etched to form the protrusion PRU in an under-cut shape. During the etching, the selectivity of the via layer VIA may be adjusted from 1:1.1 to 1:1.2. Accordingly, the protrusion PRU of the via layer VIA and the insulating pattern IPL on the protrusion PRU may be located.

Figure 15:
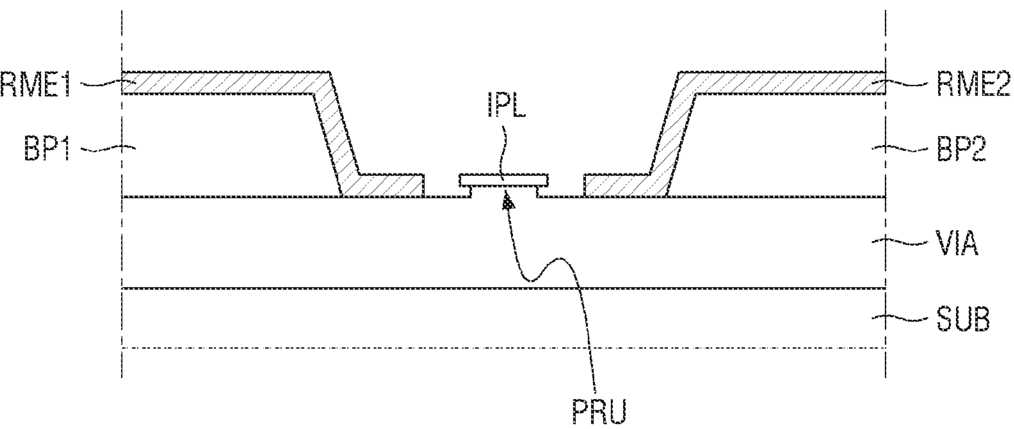

Subsequently, referring to FIG. 15, a plurality of bank patterns BP1 and BP2 is formed on the via layer VIA. A metal material layer is formed on the front surface of the first substrate SUB and is patterned, so that electrodes RME1 and RME2 are formed. The electrodes RME1 and RME2 are formed on each of the bank patterns BP1 and BP2 and the via layer VIA. The electrodes RME1 and RME2 may be located such that they are spaced apart from each other with the protrusion PRU of the via layer VIA and the insulating pattern IPL therebetween.

Figure 16:
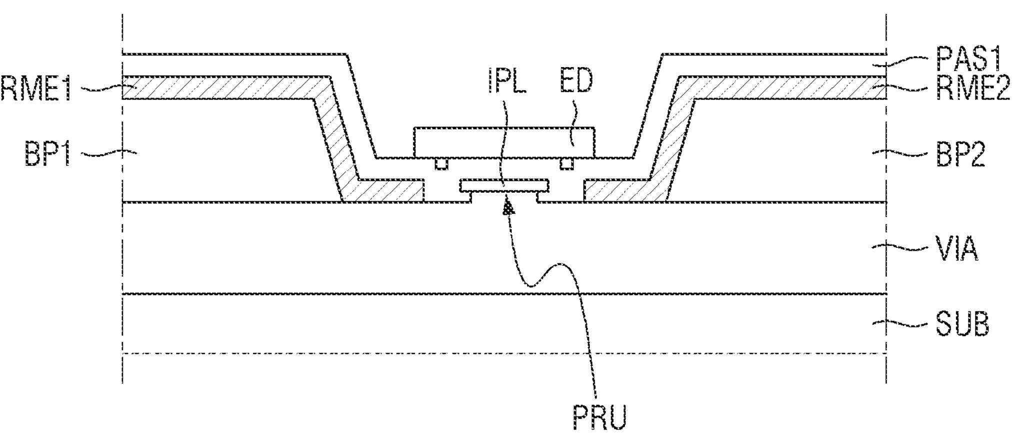

Subsequently, as shown in FIG. 16 a first passivation layer PAS1 covering the electrodes RME1 and RME2, the via layer VIA, and the insulating pattern IPL is formed, and a bank layer is formed on the first passivation layer PAS1. The first passivation layer PAS1 is formed to cover the plurality of electrodes RME1 and RME2, the via layer VIA and the insulating pattern IPL. For example, it may be formed to be generally flat on the insulating pattern IPL.

Subsequently, light-emitting elements ED are formed on the first passivation layer PAS1. The plurality of light-emitting elements ED may be located on the electrodes RME1 and RME2 via an inkjet printing process. After the ink in which the light-emitting elements ED are dispersed is ejected into the area surrounded by the bank layer, an electric signal is applied to the electrodes RME1 and RME2. Then, the light-emitting elements ED in the ink may be seated on the electrodes RME1 and RME2 while their positions and orientations are changed.

The light-emitting elements ED may be aligned between the first electrode RME1 and the second electrode RME2, and may overlap the protrusion PRU of the via layer VIA and the insulating pattern IPL. The light-emitting elements ED may be in contact with the upper surface of the first passivation layer PAS1. For example, the upper surface of the first passivation layer PAS1 and the lower surfaces of the light-emitting elements ED may be in contact with each other where the light-emitting elements ED overlap the protrusion PRU and the insulating pattern IPL. As a result, there is no space formed between the light-emitting elements ED and the first passivation layer PAS1 where the light-emitting elements ED overlap with the protrusion PRU and the insulating pattern IPL, so that it is possible to reduce or prevent the likelihood of a short-circuit being formed between the connection electrodes during a process of forming the connection electrodes CNE, which will be described later.

Figure 17:
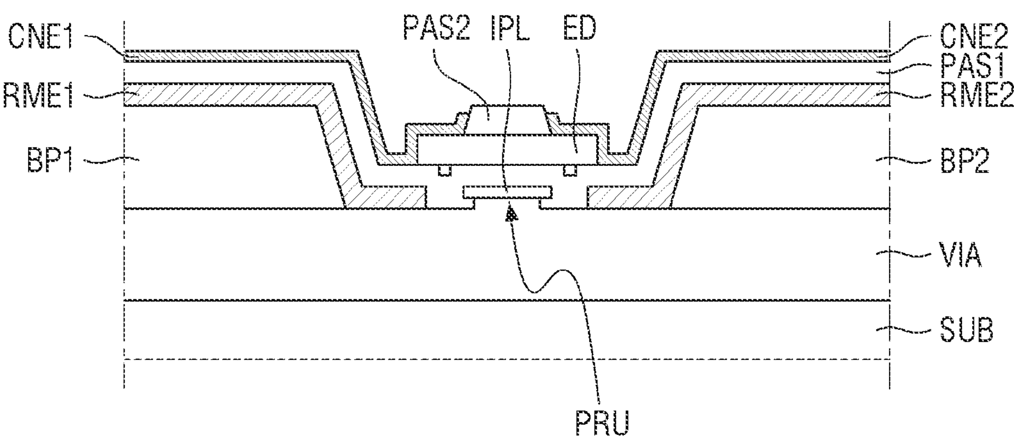

Subsequently, referring to FIG. 17, a second passivation layer PAS2 is formed on the light-emitting elements ED and the first passivation layer PAS1. The second passivation layer PAS2 may cover and fix the light-emitting elements ED. The second insulating layer PAS2 may be applied entirely on the first passivation layer PAS1, and then may be patterned so that the both ends of the light-emitting elements ED are exposed.

Subsequently, a metal material is deposited on the light-emitting elements ED and the first passivation layer PAS1, and is patterned by a mask process to form a first connection electrode CNE1 and a second connection electrode CNE2. The first connection electrode CNE1 is in contact with one ends of the light-emitting elements ED exposed by the second passivation layer PAS2, and the second connection electrode CNE2 is in contact with the opposite ends of the light-emitting elements ED.

As described above, by way of eliminating or reducing a space between the light-emitting elements ED and the first passivation layer PAS1 where the light-emitting elements ED overlap with the protrusion PRU and the insulating pattern IPL, it is possible to reduce or prevent the likelihood of a short-circuit between the connection electrodes during a process of forming the connection electrodes CNE.

The method of fabricating the display device associated with FIG. 5 has been described above with reference to FIGS. 13 to 17. A method of fabricating the display device associated with FIG. 11 may include further etching the via layer VIA described above with reference to FIG. 14 so that the protrusion PRU has a larger thickness without the insulating pattern IPL.

Figure 18:
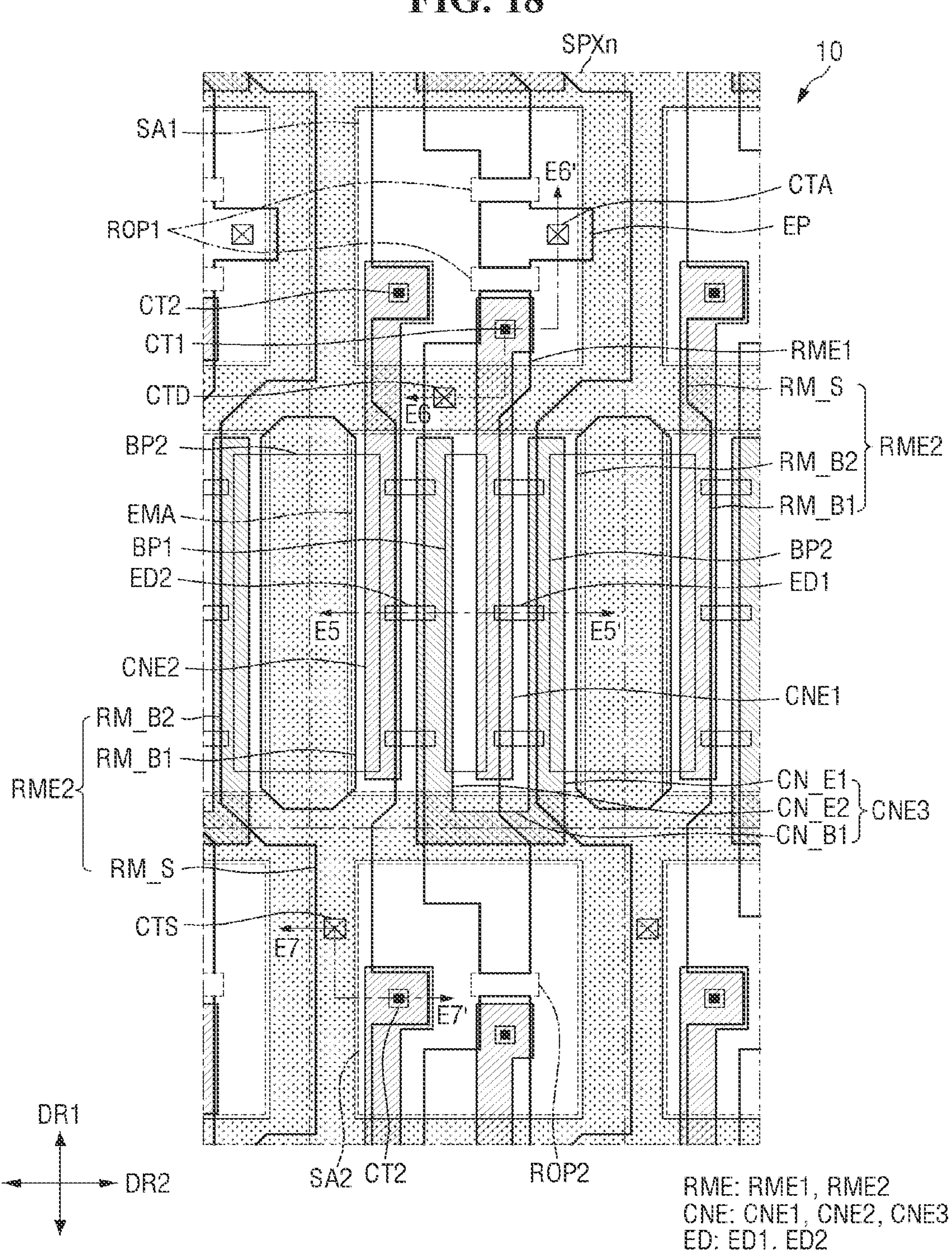
FIG. 18 is a plan view showing a sub-pixel of a display device according to one or more other embodiments of the present disclosure.
Figure 19:
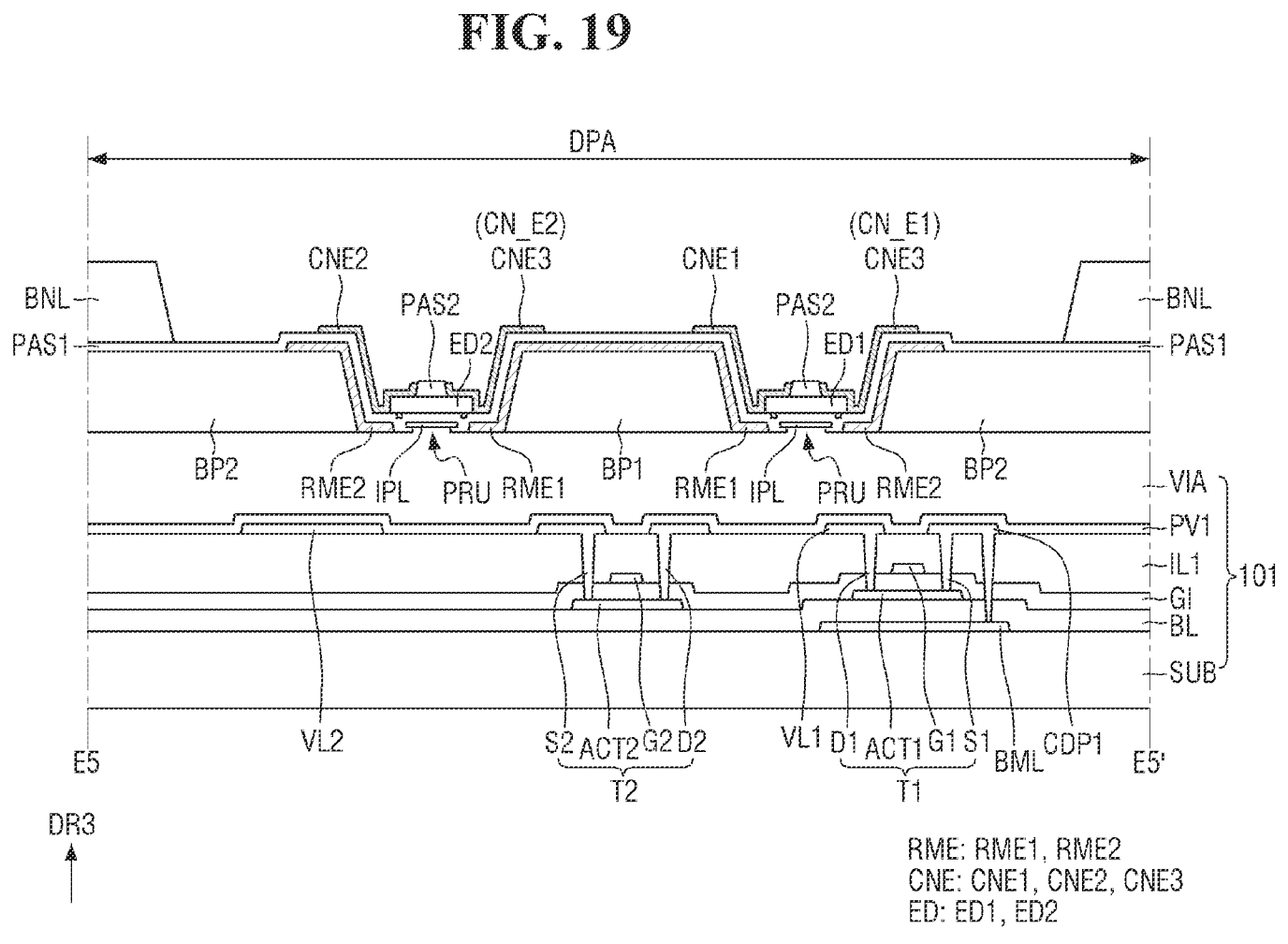
Figure 20:
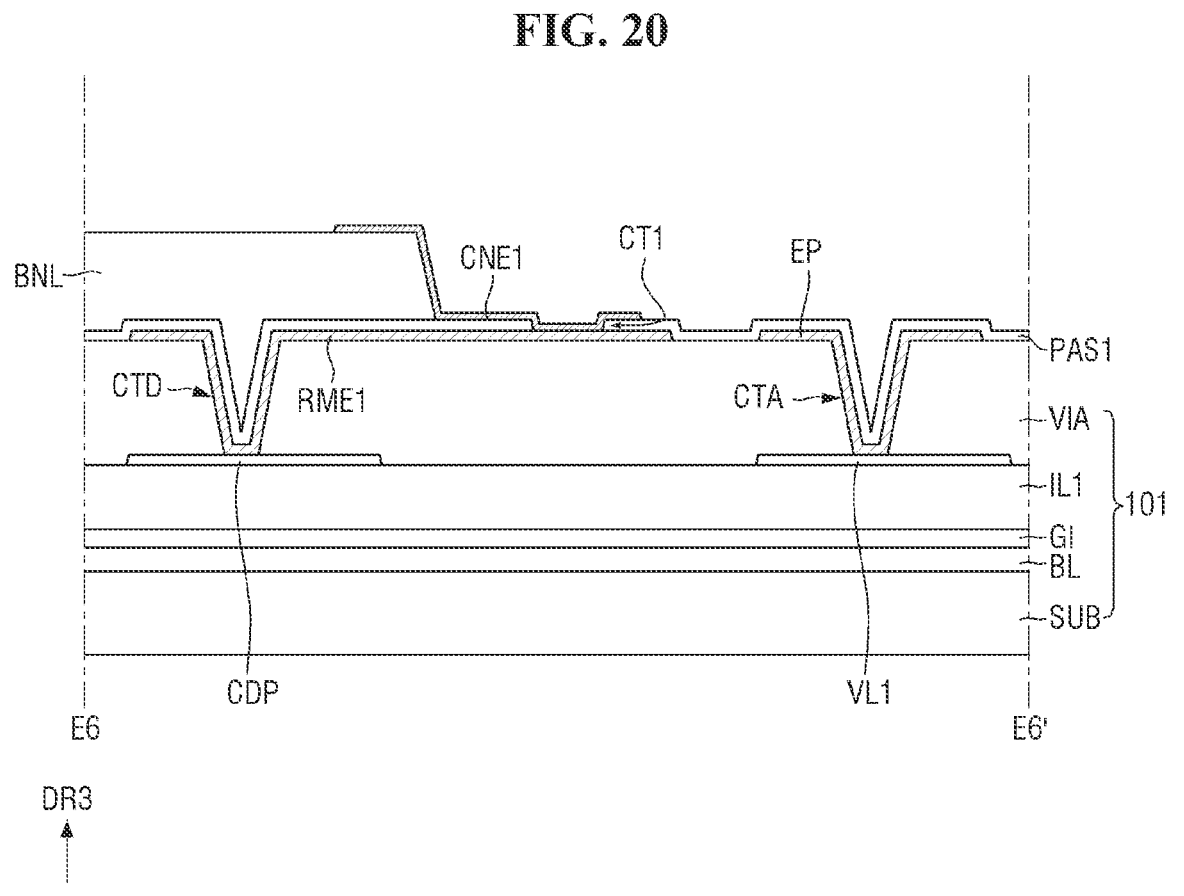
Figure 21:
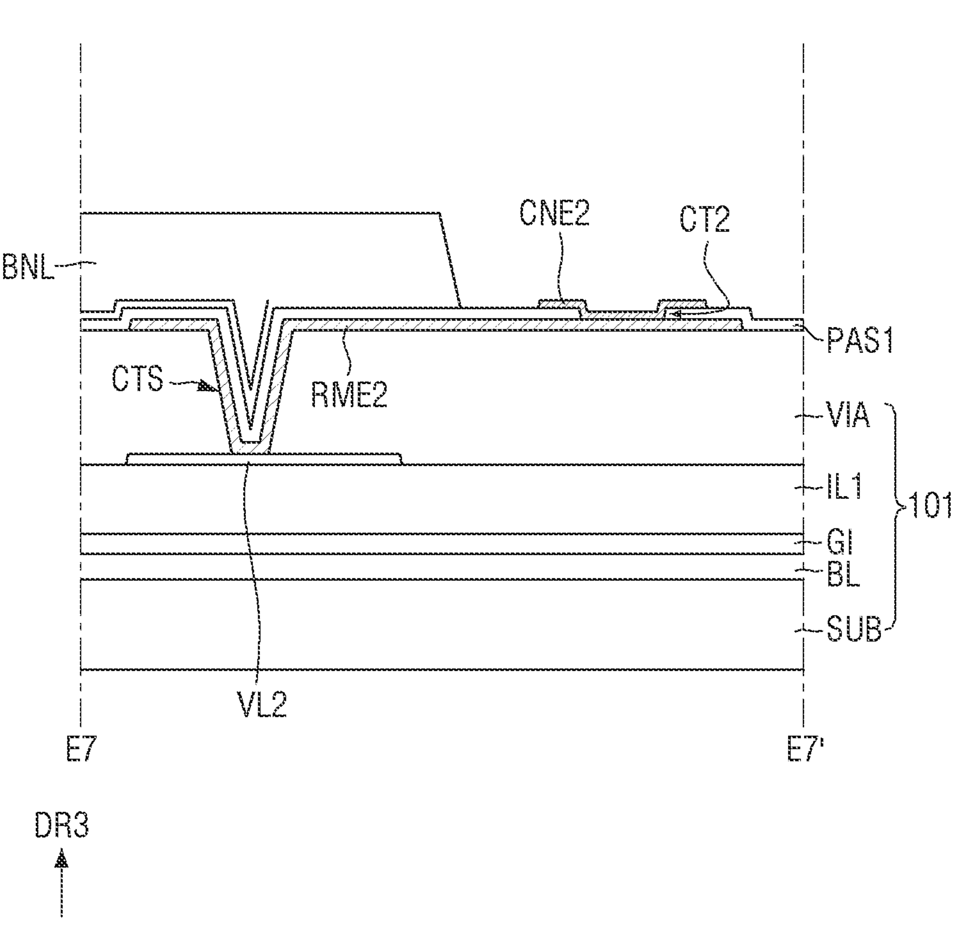
FIG. 21 is a cross-sectional view taken along the line E7-E7' of FIG. 18.

FIG. 18 is a plan view showing a sub-pixel of a display device according to one or more other embodiments of the present disclosure. FIG. 19 is a cross-sectional view taken along the line E5-E5' of FIG. 18. FIG. 20 is a cross-sectional view taken along the line E6-E6' of FIG. 18. FIG. 21 is a cross-sectional view taken along the line E7-E7' of FIG. 18.

FIG. 18 shows a layout of electrodes RME (RME1 and RME2), bank patterns BP1 and BP2, a bank layer BNL, light-emitting elements ED, and connection electrodes CNE (CNE1, CNE2, and CNE3) located in a sub-pixel SPXn of a display device 10 in plan view. FIG. 19 is a view showing a cross section from first ends to second ends of the light-emitting elements ED (ED1 and ED2) located on different electrodes RME. FIGS. 20 and 21 are cross-sectional views showing a plurality of electrode contact holes CTD, CTS, and CTA, and contacts CT1 and CT2.

The display device 10 may include more light-emitting elements ED (ED1 and ED2), and more connection electrodes CNE (CNE1, CNE2, and CNE3). The display device 10 according to the presently described one or more embodiments is different from that of one or more embodiments corresponding to FIG. 4 in that each of the sub-pixels SPXn includes larger numbers of electrodes and light-emitting elements. In the following description, descriptions will focus on the difference, and the redundant description will be omitted.

Referring to FIGS. 18 to 21, the plurality of bank patterns BP1 and BP2 may have a shape extended in the first direction DR1, and may have different widths measured in the second direction DR2. The bank patterns BP1 and BP2 may be located across the sub-pixels SPXn adjacent to each other in the second direction DR2. For example, the bank patterns BP1 and BP2 may include a first bank pattern BP1 located in the emission area EMA of each sub-pixel SPXn, and a second bank pattern BP2 located across the emission areas EMA of different sub-pixels SPXn.

The first bank pattern BP1 may be located at the center of the emission area EMA, and the second bank patterns BP2 may be spaced apart from the first bank pattern BP1 located therebetween. The first bank pattern BP1 and the second bank pattern BP2 may be arranged alternately in the second direction DR2. Light-emitting elements ED may be located between the first bank patterns BP1 and the second bank pattern BP2 spaced apart from each other.

The first bank pattern BP1 and the second bank pattern BP2 may have the same length in the first direction DR1, but may have different widths measured in the second direction DR2. A portion of the bank layer BNL extended in the first direction DR1 may overlap with the second bank pattern BP2 in the thickness direction. The first bank pattern BP1 may overlap with the first electrode RME1, and the second bank pattern BP2 may overlap with electrode branches RM_B1 and RM_B2 of the second electrode RME2 and the bank layer BNL.

The first bank pattern BP1 and the second bank pattern BP2 may have the same length in the first direction DR1, but may have different widths measured in the second direction DR2. A portion of the bank layer BNL extended in the first direction DR1 may overlap with the second bank pattern BP2 in the thickness direction. The bank patterns BP1 and BP2 may be arranged in island-shaped patterns on the front surface of the display area DPA.

The plurality of electrodes RME includes the first electrode RME1 located at the center of each of the sub-pixels SPXn, and the second electrode RME2 located across different the sub-pixels SPXn. The first electrode RME1 and the second electrode RME2 may have a shape generally extended in the first direction DR1, and may have different shapes in the emission area EMA.

The first electrode RME1 may be located at the center of the sub-pixel SPXn, and may be located on the first bank pattern BP1 in the emission area EMA. The first electrode RME1 may extend from the subsidiary area SA in the first direction DR1 to the subsidiary area SA of another sub-pixel SPXn. The width of the first electrode RME1 measured in the second direction DR2 may be different at different positions, and may be larger than the width of the first bank pattern BP1 where it overlaps the first bank pattern BP1 at least in the emission area EMA.

The second electrode RME2 may include a portion extended in the first direction DR1 and portions branching off in the vicinity of the emission area EMA. The second electrode RME2 may include an electrode stem RM_S extended in the first direction DR1, and electrode branches RM_B1 and RM_B2 branching off from the electrode stem RM_S, bent in the second direction DR2 and extended again in the first direction DR1. The electrode stem RM_S may overlap a portion of the bank layer BNL extended in the first direction DR1, and may be located on one side of the substrate area SA in the second direction DR2. The electrode branches RM_B1 and RM_B2 may branch off from a portion of the electrode stem RM_S where the bank layer BNL is extended in the first direction DR1 and the second direction DR2, and may be bent at both sides toward the second direction DR2. The electrode branches RM_B1 and RM_B2 may cross the emission area EMA in the first direction DR1, may be bent again, and may be integrated and connected to the electrode stem RM_S. That is to say, the electrode branches RM_B1 and RM_B2 of the second electrode RME2 may branch off on the upper side of the emission area EMA of a sub-pixel SPXn, and then may be connected to each other again on the lower side.

The second electrodes RME2 may include a first electrode branch RM_B1 located on the left side of the first electrode RME1, and a second electrode branch RM_B2 located on the right side of the first electrode RME1. The electrode branches RM_B1 and RM_B2 included in one second electrode RME2 may be located in the emission areas EMA of the sub-pixels SPXn adjacent to each other in the second direction DR2, and the electrode branches RM_B1 and RM_B2 of different second electrode RME2 may be located in one of the adjacent sub-pixels SPXn. The first electrode branch RM_B1 of the second electrode RME2 may be located on the left side of the first electrode RME1, and the second electrode branch RM_B2 of another second electrode RME2 may be located on the right side of the first electrode RME1.

Each of the electrode branches RM_B1 and RM_B2 of the second electrode RME2 may overlap with one side of the second bank pattern BP2. The first electrode branch RM_B1 may partially overlap with the second bank pattern BP2 located on the left side of the first bank pattern BP1, and the second electrode branch RM_B2 may partially overlap with the second bank pattern BP2 located on the right side of the first bank pattern BP1. The sides of the first electrode RME1 may respectively face, and may be spaced apart from, different electrode branches RM_B1 and RM_B2 of different second electrodes RME2. The spacing between the first electrode RME1 and the electrode branches RM_B1 and RM_B2 may be less than the spacing between the different bank patterns BP1 and BP2.

The width of the first electrode RME1 measured in the second direction DR2 may be greater than the width of the electrode stem RM_S of the second electrode RME2 and the width of the electrode branches RM_B1 and RM_B2. The first electrode RME1 may have a width that is greater than that of the first bank pattern BP1, and may overlap both sides, whereas the second electrode RME2 may have a relatively narrow width so that the electrode branches RM_B1 and RM_B2 may overlap with only one side of the second bank pattern BP2.

The first electrode RME1 may be in contact with a first conductive pattern CDP1 of the third conductive layer through a first electrode contact hole CTD where it overlaps with the portion of the bank layer BNL extended in the second direction DR2. The second electrode RME2 may be in contact with the second voltage line VL2 of the third conductive layer through a second contact hole CTS at the electrode stem RM_S. The first electrode RME1 may be located such that it overlaps with the first contact CT1 in the subsidiary area SA. The second electrode RME2 may include a portion protruding from the electrode stem RM_S in the second direction DR2 and located in the subsidiary area SA, and the protruding portion may overlap with the second contact CT2.

The first electrode RME1 may be located up to separation regions ROP1 and ROP2 of the subsidiary area SA1 whereas the second electrode RME2 may not be separated at the subsidiary area SA. One second electrode RME2 may include a plurality of electrode stems RM_S and electrode branches RM_B1 and RM_B2, may extend in the first direction DR1, and may have a shape branching off in the vicinity of the emission area EMA of each of the sub-pixels SPXn. The first electrode RME1 may be located between the separation regions ROP1 and ROP2 located in different subsidiary areas SA1 and SA2 of each of the sub-pixels SPXn, and may traverse the emission area EMA.

The display device 10 may include a line connection electrode EP that is located in the first subsidiary area SA1 among the plurality of subsidiary areas SA1 and SA2 of each of the sub-pixels SPXn, and is located between the first electrodes RME1 of different sub-pixels SPXn. In the second subsidiary area SA of the sub-pixel SPXn, the line connection electrode EP is not located, the first electrodes RME1 of different sub-pixels SPXn adjacent to one another in the first direction DR1 may be spaced apart from one another. In the sub-pixel SPXn shown in FIG. 18 among the plurality of sub-pixels SPXn, the first subsidiary area SA1 in which the line connection electrode EP is located is located on the upper side of the emission area EMA, while the second subsidiary area SA2 may be located on the lower side of the emission area EMA. On the other hand, in the sub-pixel SPXn adjacent to the sub-pixel SPXn of FIG. 18 in the first direction DR1, the first subsidiary area SA1 in which the line connection electrode EP is located may be located on the lower side of the emission area EMA, and the second subsidiary area SA2 may be located on the upper side of the emission area EMA.

The first electrode RME1 may be spaced apart from the line connection electrode EP in the first subsidiary area SA1 with the first separation region ROP1 therebetween. Two first separation regions ROP1 may be located in one first sub-area SA1. The line connection electrode EP may be spaced apart from the first electrode RME1 located in the sub-pixel SPXn with the lower first separation region ROP1 therebetween, and may be spaced apart from the first electrode RME1 located in another sub-pixel SPXn with the upper first separation region ROP1 therebetween. One second separation region ROP2 may be located in the second subsidiary area SA2, and different first electrodes RME1 may be spaced apart from each other in the first direction DR1.

The line connection electrode EP may be connected to a first voltage line VL1 of the third conductive pattern through a third electrode contact hole CTA penetrating the via layer VIA. The first electrode RME1 may be formed such that it is connected to the line connection electrode EP, and an electric signal applied to align the light-emitting elements ED may be applied to the first electrode RME1 from the first voltage line VL1 through the line connection electrode EP. In the process of aligning the light-emitting elements ED, signals are applied to the first voltage line VL1 and to the second voltage line VL2, and these are transmitted to the first electrode RME1 and the second electrode RME2, respectively.

Incidentally, the second electrode contact hole CTS may have a relative arrangement different from that of the third electrode contact hole CTA, which will be described later. The second electrode contact hole CTS may be located at a portion of the bank layer BNL that surrounds the second subsidiary area SA2, and the third electrode contact hole CTA may be located in the first subsidiary area SA1. Because the second electrode contact hole CTS and the third electrode contact hole CTA respectively expose the upper surfaces of different voltage lines VL1 and VL2, the positions of the electrode contact holes may be determined accordingly.

The bank layer BNL may surround the emission area EMA and the plurality of the subsidiary areas SA1 and SA2, similarly to one or more of the aforementioned embodiments. However, in one or more embodiments in which the display device 10 includes subsidiary areas SA1 and SA2 that are separated from each other, the regions surrounded by the bank layer BNL may be distinguished from each other.

The bank layer BNL is identical to that of one or more of the above-described embodiments except that it surrounds different subsidiary areas SA1 and SA2.

The plurality of light-emitting elements ED may be located on different electrodes RME between different bank patterns BP1 and BP2. The light-emitting elements ED may include first light-emitting elements ED1 having respective ends located on the first electrode RME1 and the second electrode branch RM_B2 of the second electrode RME2, and second light-emitting elements ED2 having respective ends located on the first electrode RME1 and the first electrode branch RM_B1 of another second electrode RME2. The first light-emitting elements ED1 may be located on the right side of the first electrode RME1, and the second light-emitting elements ED2 may be located on the left side of the first electrode RME1. The first light-emitting elements ED1 may be located on the first electrode RME1 and the second electrode RME2, and the second light-emitting elements ED2 may be located on the first electrode RME1 and another second electrode RME2.

Incidentally, according to one or more embodiments, in the emission area EMA, the protrusion PRU of the via layer VIA, and the insulating pattern IPL located on the protrusion PRU, may be located between the first electrode RME1 and the second electrode RME2.

The protrusions PRU of the via layer VIA and the insulating patterns IPL may extend in the first direction DR1, and may be spaced apart from one another in the second direction DR2. The protrusions PRU of the via layer VIA and the insulating patterns IPL may be formed in linear patterns extended in the first direction DR1. Each of the protrusions PRU of the via layer VIA and the insulating patterns IPL may overlap the first light-emitting elements ED1 and the second light-emitting elements ED2. The protrusions PRU of the via layer VIA and the insulating patterns IPL are located to eliminate the space between the light-emitting elements ED1 and ED2 and the first passivation layer PAS1, so that it is possible to reduce or prevent the likelihood of the connection electrodes CNE1, CNE2, and CNE3 forming a short circuit through the space between the light-emitting elements ED1 and ED2 and the first passivation layer PAS1.

The plurality of connection electrodes CNE (CNE1, CNE2, and CNE3) may include a first connection electrode CNE1, a second connection electrode CNE2, and a third connection electrode CNE3.

The first connection electrode CNE1 may have a shape extended in the first direction DR1, and may be located on the first electrode RME1. A portion of the first connection electrode CNE1 located on the first bank pattern BP1 may overlap the first electrode RME1, and may extend in the first direction DR1 from it to be located in the first subsidiary area SA1 located on the upper side of the emission area EMA beyond the bank layer BNL. The first connection electrode CNE1 may be in contact with the first electrode RME1 through the first contact CT1 in the first subsidiary area SA1.

The second connection electrode CNE2 may have a shape extended in the first direction DR1, and may be located on the second electrode RME2. A portion of the second connection electrode CNE2 located on the second bank pattern BP2 may overlap with the second electrode RME2, and may extend in the first direction DR1 from it to be located in the first subsidiary area SA1 located on the upper side of the emission area EMA beyond the bank layer BNL. The second connection electrode CNE2 may be in contact with the second electrode RME2 through the second contact CT2 in the first subsidiary area SA1.

On the other hand, in a sub-pixel SPXn that is adjacent to the sub-pixel SPXn of FIG. 18 in the first direction DR1, the first connection electrode CNE1 and the second connection electrode CNE2 may be in contact with the first and second electrodes RME1 and RME2 through the contacts CT1 and CT2, respectively, in the second subsidiary area SA2.

The third connection electrode CNE3 may include extensions CN_E1 and CN_E2 extended in the first direction DR1, and a first bridge CN_B1 connecting between the extensions CN_E1 and CN_E2. The first extension CN_E1 faces the first connection electrode CNE1 in the emission area EMA, and is located on the second electrode branch RM_B2 of the second electrode RME2, and the second extension CN_E2 faces the second connection electrode CNE2 in the emission area EMA and is located on the first electrode RME1. The first bridge CN_B1 may extend in the second direction DR2 on the bank layer BNL located on the lower side of the emission area EMA, and may connect the first extension CN_E1 with the second extension CN_E2. The third connection electrode CNE3 may be located on the emission area EMA and the bank layer BNL, and may not be connected directly to the electrodes RME. The second electrode branch RM_B2 located under the first extension CN_E1 may be electrically connected to the second voltage line VL2, and the second supply voltage applied to the second electrode branch RM_B2 may not be transmitted to the third connection electrode CNE3.

In concluding the detailed description, those skilled in the art will appreciate that many variations and modifications can be made to the embodiments without substantially departing from the aspects of the present disclosure. Therefore, the disclosed embodiments of the disclosure are used in a generic and descriptive sense only and not for purposes of limitation.

What is claimed is:

1. A display device comprising:
- a substrate;
- a via layer above the substrate, and comprising a protrusion;
- an insulating pattern above the protrusion, and having a width that is greater than a width of the protrusion;
- first and second electrodes above the via layer, and spaced apart from each other with the protrusion and the insulating pattern therebetween;
- a first insulating layer above the protrusion, the insulating pattern, the first electrode, and the second electrode, and covering side surfaces of the protrusion and the insulating pattern;
- a light-emitting element above the first insulating layer, and between the first electrode and the second electrode;
- a first connection electrode connected to a first end of the light-emitting element; and
- a second connection electrode connected to a second end of the light-emitting element.

2. The display device of claim 1, wherein the protrusion and the via layer are integral, and
- wherein the protrusion protrudes toward the light-emitting element.

3. The display device of claim 1, wherein the protrusion and the insulating pattern overlap the light-emitting element.

4. The display device of claim 1, wherein one of the side surfaces of the insulating pattern protrudes outwardly more than one of the side surfaces of the protrusion.

5. The display device of claim 4, wherein the width of the protrusion and the width of the insulating pattern are less than a distance between the first electrode and the second electrode.

6. The display device of claim 1, wherein a thickness of the protrusion and a thickness of the insulating pattern are less than a thickness of the first electrode or the second electrode.

7. The display device of claim 1, wherein a sum of a thickness of the protrusion and a thickness of the insulating pattern is equal to a thickness of the first electrode or the second electrode.

8. The display device of claim 1, wherein one of the side surfaces of the protrusion is perpendicular to a surface of the via layer.

9. The display device of claim 1, wherein one of the side surfaces of the protrusion is inclined, and wherein a width of an upper surface of the protrusion is less than a width of a lower surface of the protrusion.

10. The display device of claim 1, wherein the first insulating layer is in contact with a lower surface of the light-emitting element where the insulating pattern and the light-emitting element overlap each other.

11. A display device comprising:

a substrate;

a via layer above the substrate, and comprising a protrusion;

first and second electrodes above the via layer, and spaced apart from each other with the protrusion therebetween;

a first insulating layer above the protrusion, the first electrode, and the second electrode;

a light-emitting element above the first insulating layer, and between the first electrode and the second electrode;

a first connection electrode connected to a first end of the light-emitting element; and a second connection electrode connected to a second end of the light-emitting element, wherein a thickness of the protrusion is equal to a thickness of the first electrode or the second electrode.

12. The display device of claim 11, wherein the protrusion and the via layer are integral, and wherein the protrusion protrudes toward the light-emitting element.

13. The display device of claim 11, wherein an upper surface of the protrusion is in contact with the first insulating layer, and wherein the first insulating layer is in contact with a lower surface of the light-emitting element.

14. The display device of claim 11, wherein a width of the protrusion is less than a distance between the first electrode and the second electrode.

15. The display device of claim 11, further comprising a second insulating layer above the light-emitting element, wherein the first connection electrode and the second connection electrode are spaced apart from each other with the second insulating layer therebetween.

16. A method of fabricating a display device, the method comprising:

forming a via layer above a substrate;

forming an insulating pattern above the via layer;

forming a protrusion under the insulating pattern by etching the via layer;

forming first and second electrodes spaced apart from each other above the via layer;

forming a first insulating layer above the insulating pattern, the first electrode, and the second electrode;

aligning a light-emitting element above the first insulating layer between the first electrode and the second electrode;

forming a first connection electrode connected to a first end of the light-emitting element; and forming a second connection electrode connected to a second end of the light-emitting element.

17. The method of claim 16, wherein the forming the protrusion comprises reducing a thickness of the via layer by using the insulating pattern as a hard mask.

18. The method of claim 16, wherein the protrusion is over-etched underneath the insulating pattern to be formed in an under-cut shape.

19. The method of claim 16, wherein a sum of a thickness of the protrusion and a thickness of the insulating pattern is equal to a thickness of the first electrode or the second electrode.

20. The method of claim 16, wherein the first insulating layer is in contact with a lower surface of the light-emitting element.

* * * * *